US008746669B2

(12) United States Patent
Takanami

(10) Patent No.: US 8,746,669 B2
(45) Date of Patent: Jun. 10, 2014

(54) CHIP SUPPLY PALLET AND CHIP SUPPLY APPARATUS

(75) Inventor: Yasuo Takanami, Fukuoka (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/863,056

(22) PCT Filed: Feb. 6, 2009

(86) PCT No.: PCT/JP2009/052450
§ 371 (c)(1),
(2), (4) Date: Jul. 15, 2010

(87) PCT Pub. No.: WO2009/099255
PCT Pub. Date: Aug. 13, 2009

(65) Prior Publication Data
US 2010/0290869 A1    Nov. 18, 2010

(30) Foreign Application Priority Data

Feb. 8, 2008  (JP) ............................... P2008-028785
Feb. 21, 2008 (JP) ............................... P2008-039632
Feb. 21, 2008 (JP) ............................... P2008-039633

(51) Int. Cl.
*B23Q 3/00* (2006.01)
*B65G 59/02* (2006.01)

(52) U.S. Cl.
USPC .......... 269/309; 414/796.9; 414/935; 29/740; 29/832

(58) Field of Classification Search
USPC ............. 414/222.01, 796.9, 935; 248/346.06; 257/E21.001; 269/309; 438/458, 464; 29/740, 832

IPC .................................... B65G 59/02; B23Q 3/00
See application file for complete search history.

(56) References Cited

U.S. PATENT DOCUMENTS 2,394,784 A * 2/1946 Kelly ............................ 292/240
2,440,764 A * 5/1948 Wilson ........................... 49/371
(Continued)

FOREIGN PATENT DOCUMENTS

DE    33 38 994 A1    5/1984
JP    02-231740 A     9/1990
(Continued)

OTHER PUBLICATIONS

JP2005268274A1 English Machine Translation.*
(Continued)

*Primary Examiner* — Joseph J Hail
*Assistant Examiner* — Marc Carlson
(74) *Attorney, Agent, or Firm* — Pearne & Gordon LLP

(57) ABSTRACT

To provide a chip supply pallet preventing destruction of a chip and preventing a reduction in a productivity from being brought about in exchanging a wafer sheet, the chip supply pallet includes a first member 33 having a tension ring 51 brought into contact with a wafer sheet from a lower side, and a fixing member 54 of fixing a ring frame holding the wafer sheet on an inner side on a lower side of the wafer sheet brought into contact with the tension ring 51, and a second member 34 having a fixed portion for fixing to a predetermined position of a chip supply apparatus and a held portion 36 of being held when the chip interchanging pallet 3 is transferred, and the first member 33 is configured to be able to rotationally displace relative to the second member 34 fixed to the predetermined position of the chip supply apparatus.

7 Claims, 26 Drawing Sheets

(56) References Cited

U.S. PATENT DOCUMENTS

| | | | |
|---|---|---|---|
| 2,493,980 A * | 1/1950 | Lambert | 292/48 |
| 3,217,904 A * | 11/1965 | Knight, Jr. | 406/39 |
| 4,685,249 A * | 8/1987 | Jacox | 49/395 |
| 5,876,556 A * | 3/1999 | Takanami | 156/556 |
| 5,887,916 A * | 3/1999 | Finkelstein et al. | 292/241 |
| 6,215,194 B1 * | 4/2001 | Nakabayashi | 257/782 |
| 6,461,938 B2 * | 10/2002 | Nakabayashi | 438/458 |
| 6,524,052 B1 * | 2/2003 | Yamauchi et al. | 414/331.1 |
| 7,348,199 B2 * | 3/2008 | Nagai et al. | 438/33 |
| 7,472,472 B2 * | 1/2009 | Takanami | 29/740 |
| 7,557,898 B2 * | 7/2009 | Tasaka et al. | 349/187 |
| 7,666,760 B2 * | 2/2010 | Nakamura | 438/464 |
| 8,020,287 B2 * | 9/2011 | Emoto et al. | 29/834 |
| 8,211,261 B2 * | 7/2012 | Maki et al. | 156/265 |
| 2001/0001078 A1 * | 5/2001 | Nakabayashi | 438/458 |
| 2003/0177633 A1 * | 9/2003 | Haji et al. | 29/743 |
| 2004/0163243 A1 * | 8/2004 | Noda et al. | 29/834 |
| 2005/0132567 A1 * | 6/2005 | Noda et al. | 29/833 |
| 2008/0247143 A1 * | 10/2008 | Emoto et al. | 361/760 |
| 2010/0172736 A1 * | 7/2010 | Takanami | 414/796.9 |

FOREIGN PATENT DOCUMENTS

| | | | |
|---|---|---|---|
| JP | 05-029440 A | | 2/1993 |
| JP | 09-022933 A | | 1/1997 |
| JP | 09-190988 A | | 7/1997 |
| JP | 2005-268274 A | | 9/2005 |
| JP | 2005268274 A | * | 9/2005 |
| JP | 2006041031 A | * | 2/2006 |
| JP | 2007081037 A | * | 3/2007 |
| JP | 2007142452 A | * | 6/2007 |
| JP | 2009188306 A | * | 8/2009 |
| WO | 2006/134532 A2 | | 12/2006 |

OTHER PUBLICATIONS

International Search Report for PCT/JP2009/052450 dated May 10, 2009.

* cited by examiner

CHIP SUPPLY PALLET AND CHIP SUPPLY APPARATUS

TECHNICAL FIELD

The present invention relates to a pallet for supplying a chip that is configured by forming a semiconductor wafer into individual pieces.

BACKGROUND ART

A chip supply apparatus is an apparatus of carrying out an operation of exfoliating a chip from a wafer sheet by pushing up a chip pasted on an elongatable and contractable wafer sheet from a lower side of a wafer sheet and adsorbing the chip from an upper side by a nozzle to supply to a supply object of a board or the like. The chip pasted on the wafer sheet is configured by forming a semiconductor wafer into individual pieces by dicing, an interval between the chips contiguous to each other is narrow, it is difficult to exfoliate only one chip, and therefore, in the chip supply apparatus, the interval between the chips is widened by exerting a tension to the wafer sheet (refer to Patent References 1 and 2).

Patent Reference 1: JP-A-2-231740
Patent Reference 2: JP-A-5-29440

When the tension is interrupted from exerting to the wafer sheet exerted with the tension once, an elongation remains, and the wafer sheet is brought into a state of being slackened on an inner side of a wafer ring of holding an outer periphery of the wafer sheet. In a background art, in interchanging the wafer sheet finished to use the chip, the wafer sheet is detached from the chip supply apparatus having a tension ring of exerting the tension to the wafer sheet, a new wafer sheet is molded in place thereof, however, when the wafer sheet brought into a state in which a chip remains, there is a possibility that the chips contiguous to each other are brought into contact with each other by slacking the wafer sheet, and a brittle edge or corner portion is destructed. Further, as a different problem, in an apparatus such as a multi-chip bonder of mounting a variety of parts to a board, the wafer sheet is interchanged at a high frequency, and therefore, a time period of mounting and detaching the wafer sheet to and from the chip supply apparatus is required at every time of interchange and a productivity is reduced.

DISCLOSURE OF THE INVENTION

Hence, it is an object of the invention to provide a chip supply pallet preventing a chip from being destructed and preventing a reduction in productivity from being brought about in interchanging a wafer sheet.

A chip supply pallet described in a first aspect of the invention is a chip supply pallet for mounting a wafer sheet pasted with a semiconductor wafer formed into individual pieces of a plurality of chips to a chip supply apparatus in a state of being exerted with a tension, the chip supply pallet comprising a first member having a tension ring brought into contact with the wafer sheet from a lower side thereof and a fixing member of fixing a ring frame holding the wafer sheet on an inner side thereof on a lower side of the wafer sheet brought into contact with the tension ring, and a second member having a fixed portion for fixing to a predetermined position of the chip supply apparatus and a held portion of being held when a chip interchange pallet is transferred, wherein the first member is configured to be able to rotationally displace relative to the second member fixed to the predetermined position of the chip supply apparatus.

The chip supply pallet described in a second aspect of the invention is the chip supply pallet described in the first aspect of the invention further comprising a restricting unit for restricting a relative rotational displacement of the first member and the second member.

According to the chip supply pallet of the invention, the wafer sheet can be transferred while maintaining a state of exerting the tension thereto, and therefore, the chips pasted on the wafer sheet can be prevented from colliding with each other, further, it is not necessary to mount or detach the wafer sheet, and therefore, a waiting time period of a mounting operation can be shortened.

BEST MODE FOR CARRYING OUT THE INVENTION

Figure 1:
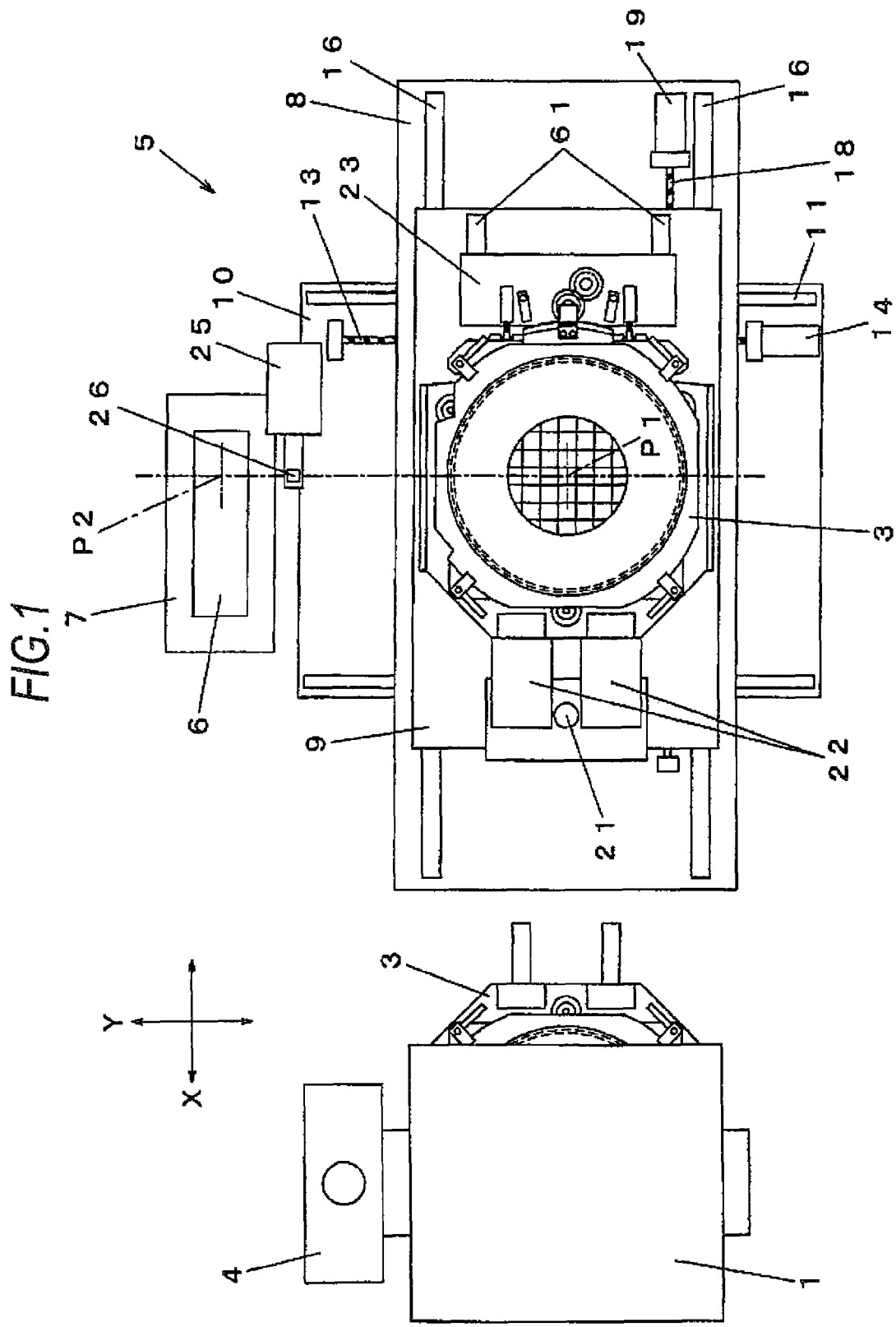
FIG. 1 is a plane view of a chip supply apparatus according to an embodiment of the invention.
Figure 2:
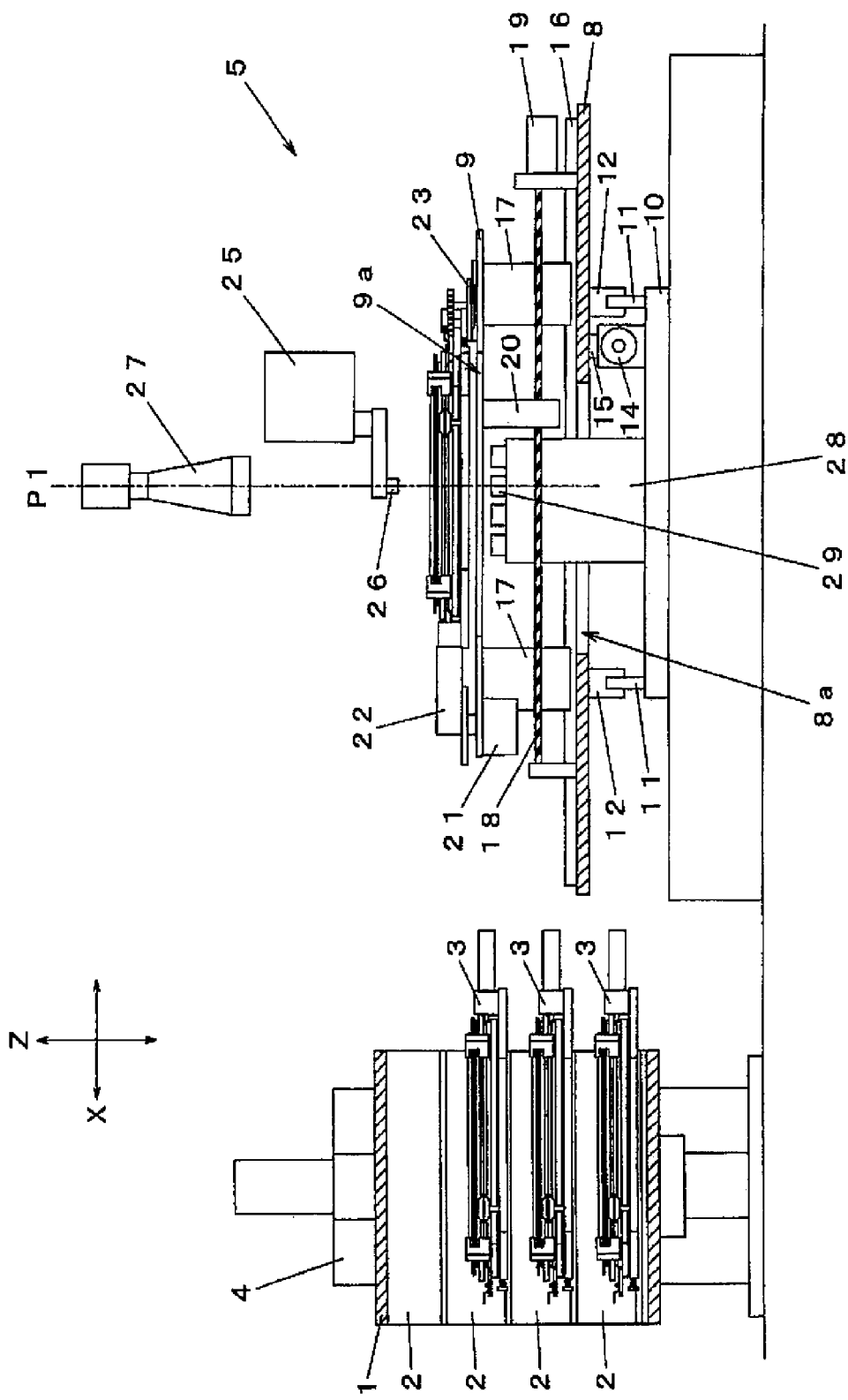
FIG. 2 is a side view of the chip supply apparatus according to the embodiment of the invention.
Figure 3:
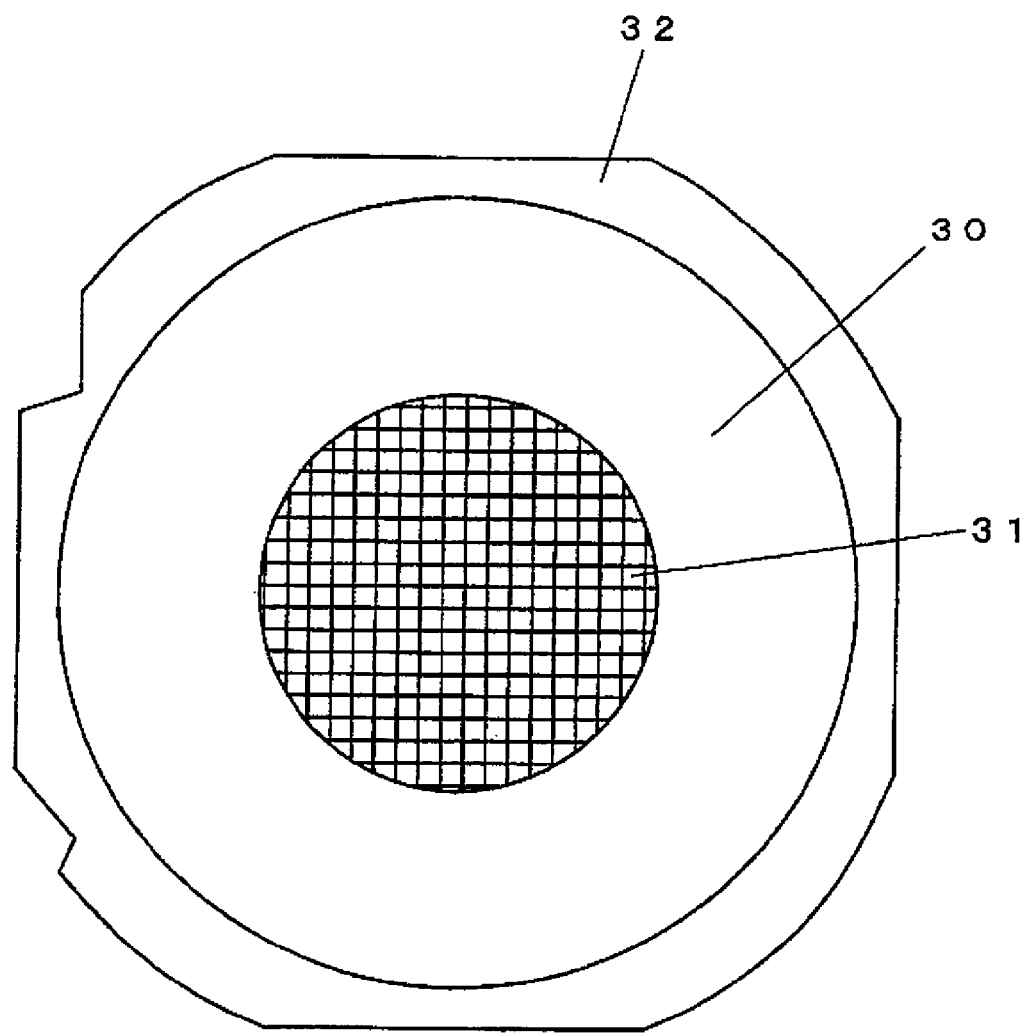
FIG. 3 is a plane view of a wafer sheet and a ring frame according to the embodiment of the invention.
Figure 4:
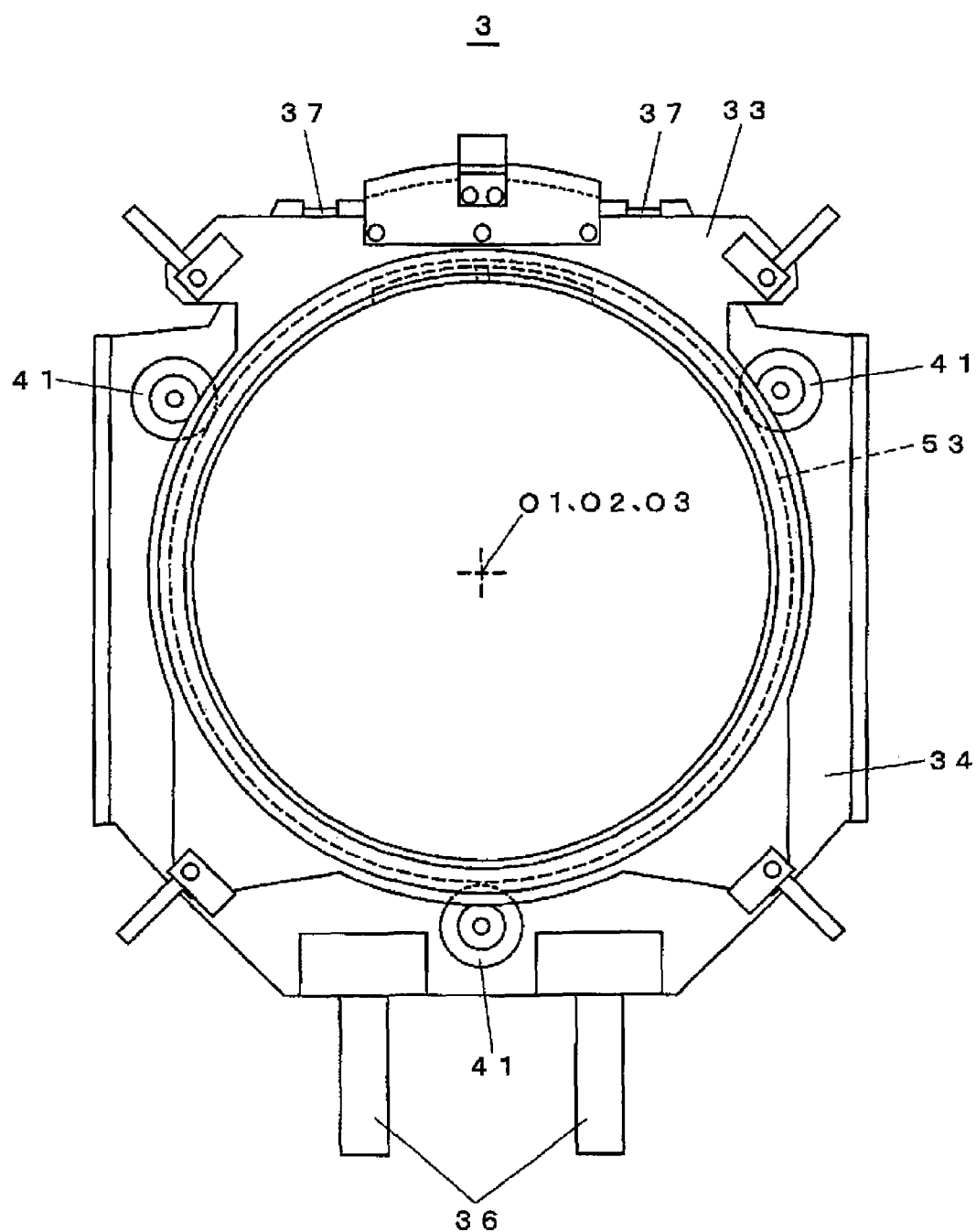
FIG. 4 is a plane view of a chip supply pallet according to the embodiment of the invention.
Figure 5:
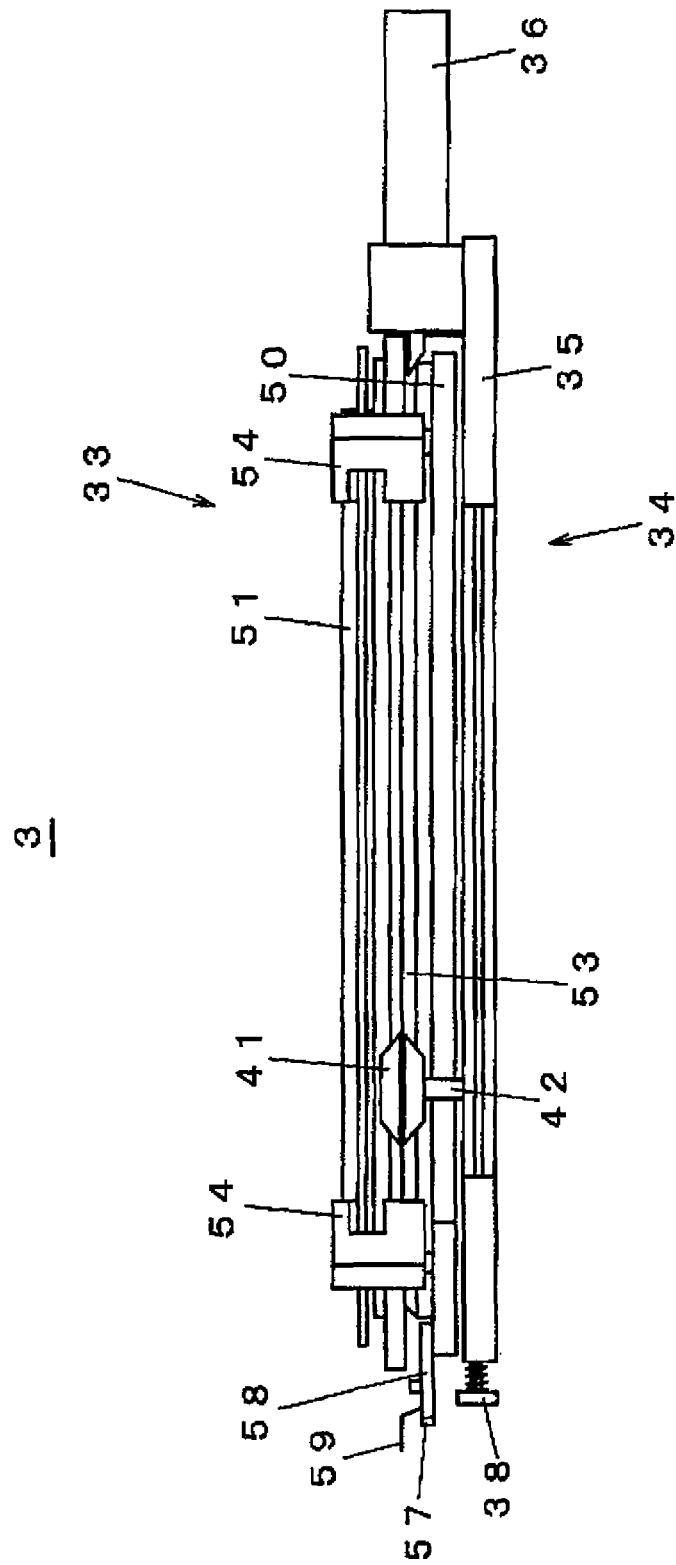
FIG. 5 is a side view of the chip supply pallet according to the embodiment of the invention.
Figure 6:
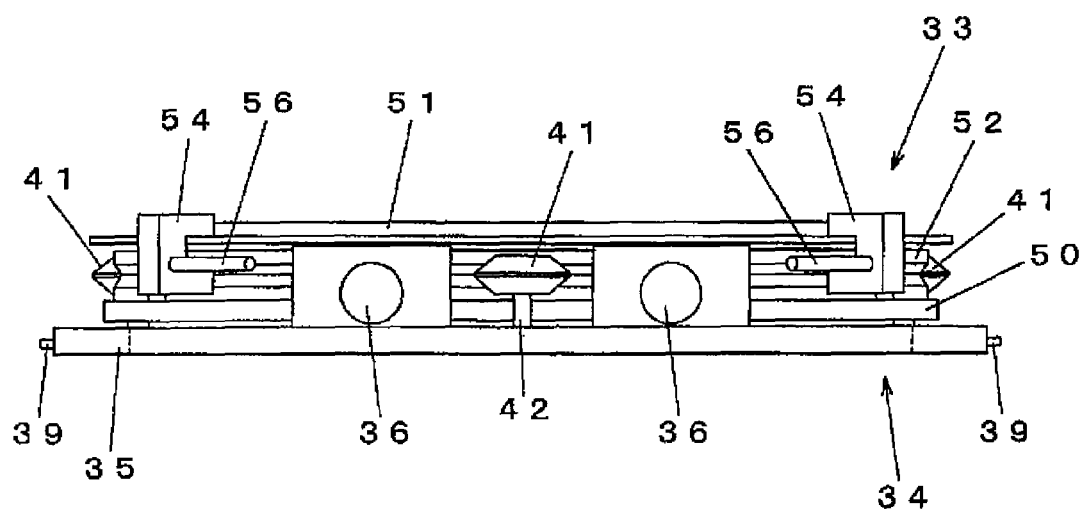
FIG. 6 is a front view of the chip supply pallet according to the embodiment of the invention.
Figure 7:
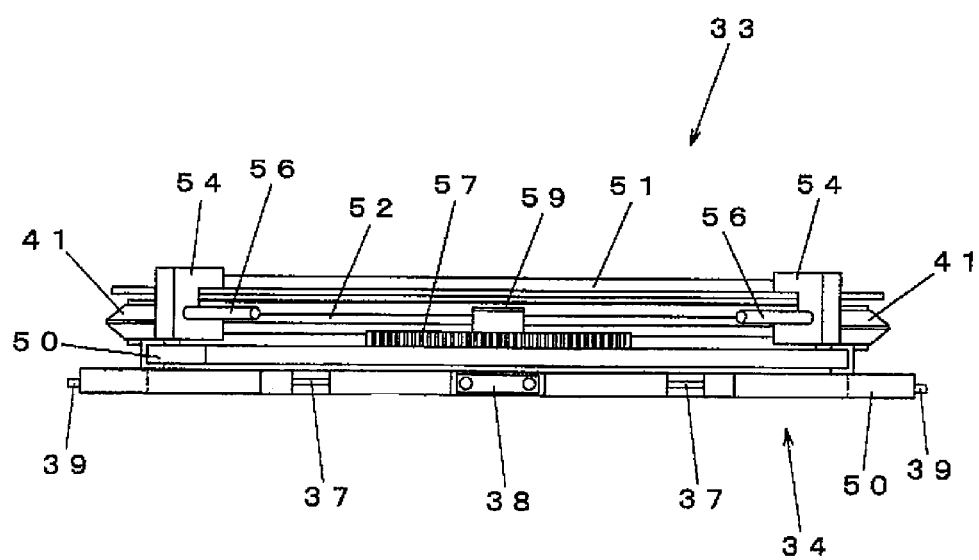
FIG. 7 is a rear view of the chip supply pallet according to the embodiment of the invention.
Figure 8:
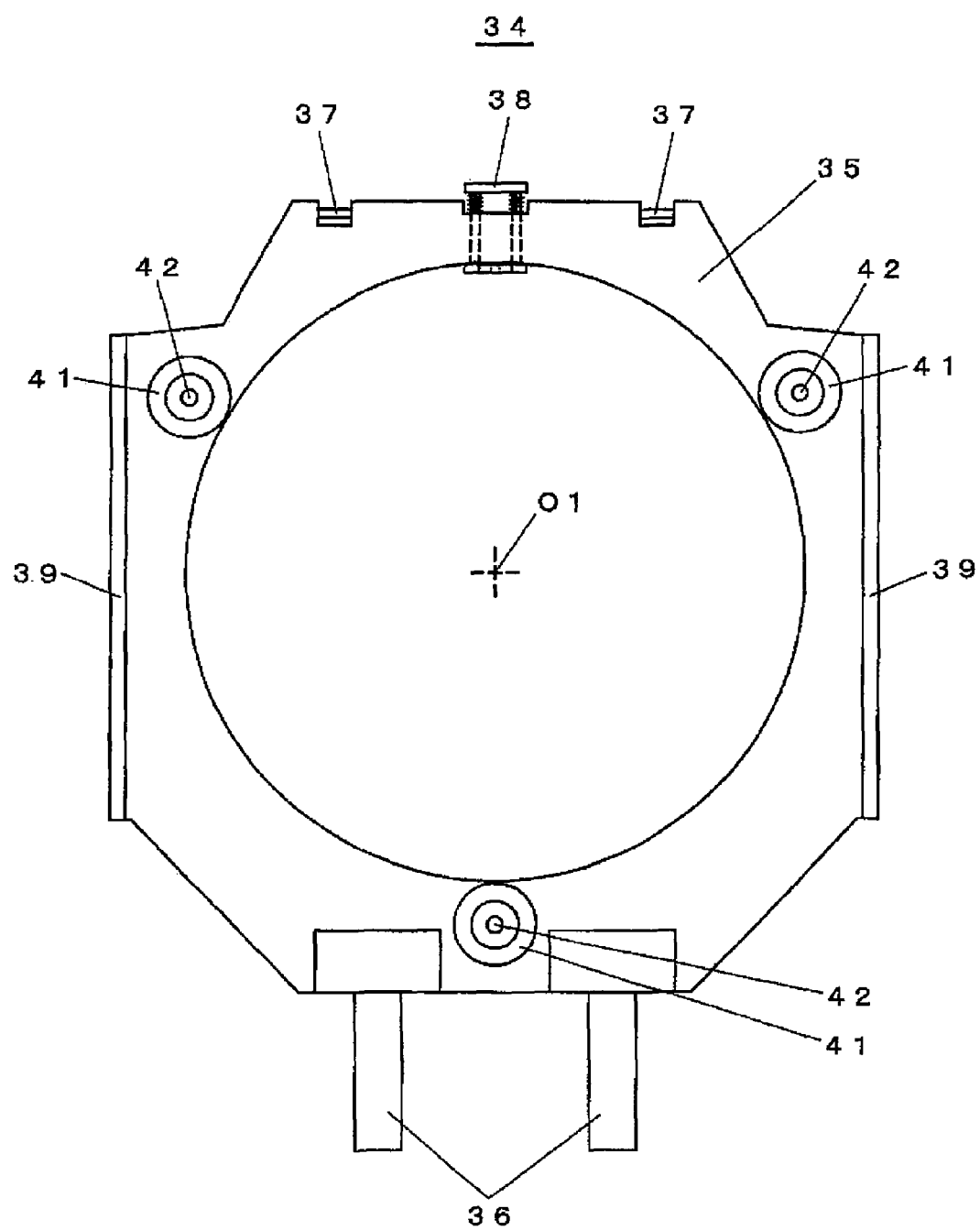
FIG. 8 is a plane view of a second member according to the embodiment of the invention.
Figure 9:
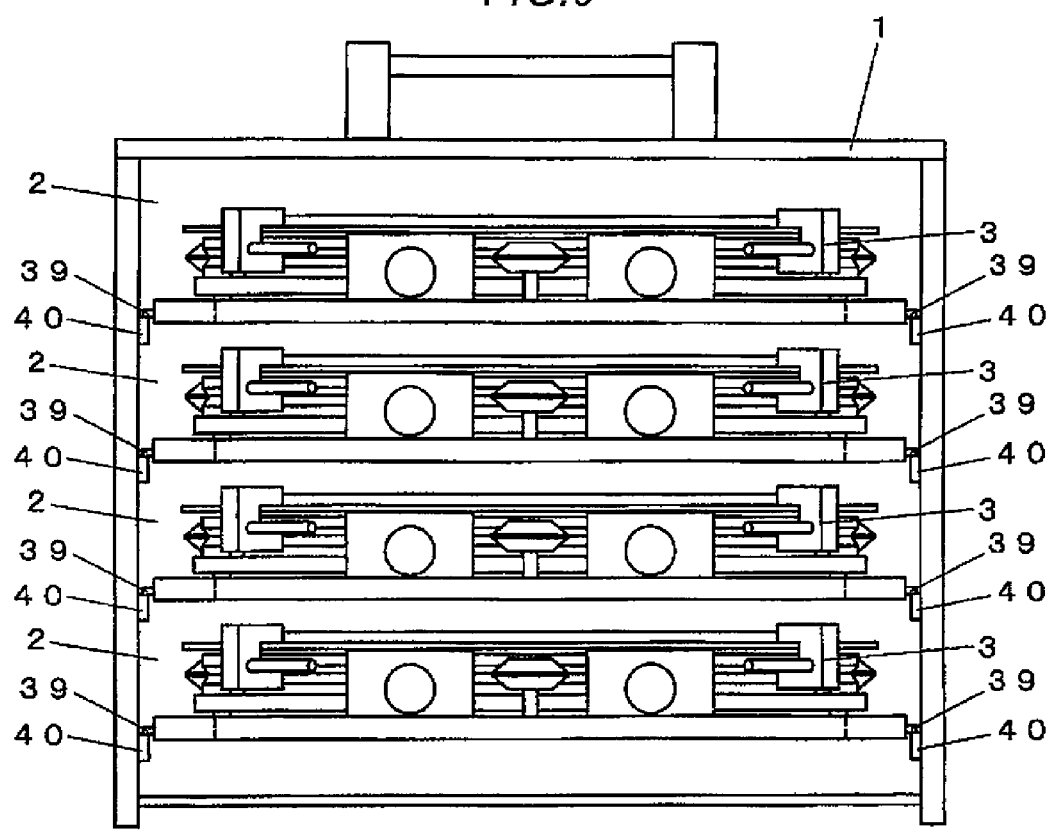
FIG. 9 is a plane view of an inner structure of a magazine according to the embodiment of the invention.
Figure 10:
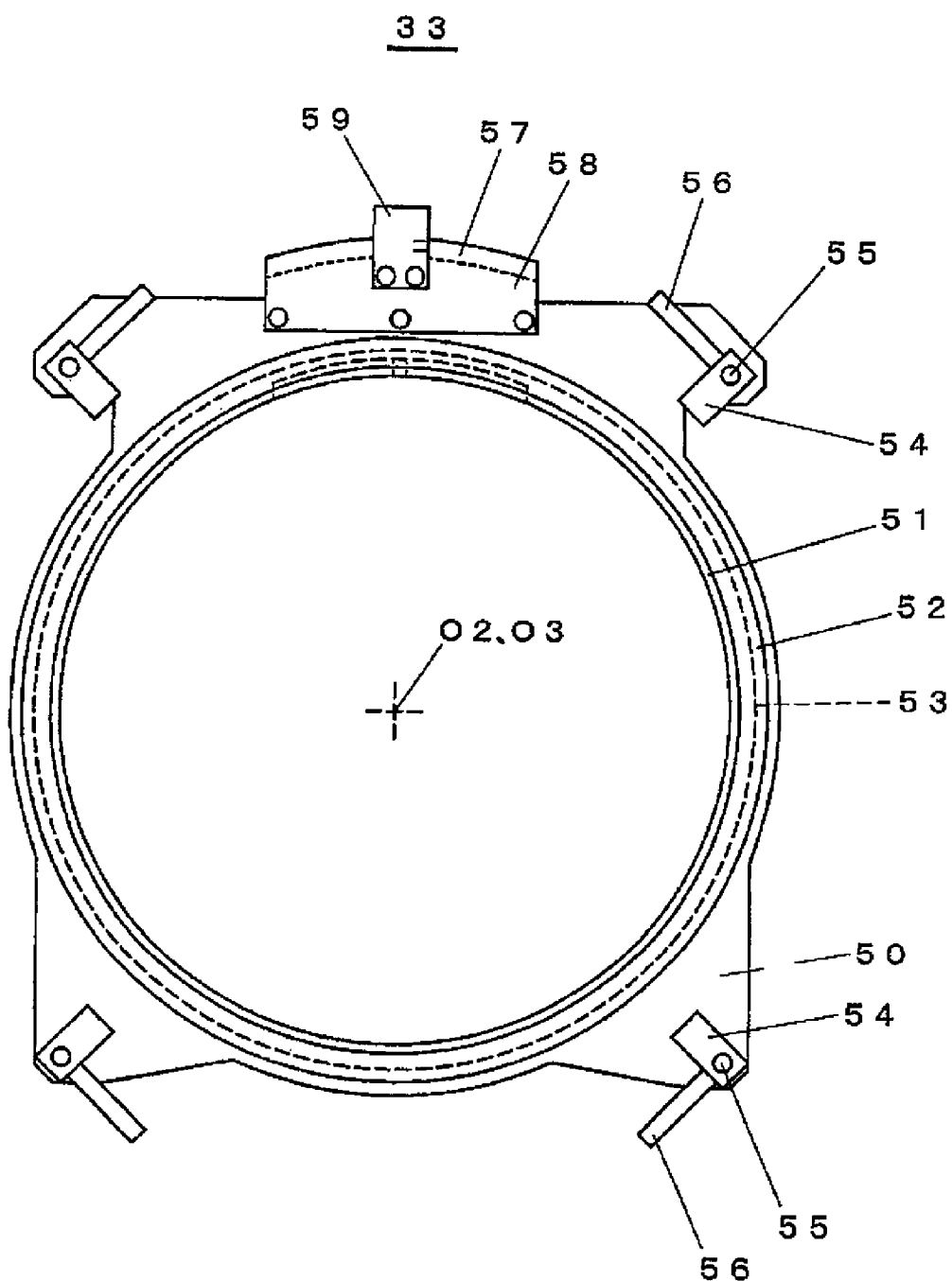
FIG. 10 is a plane view of a first member according to the embodiment of the invention.
Figure 11:
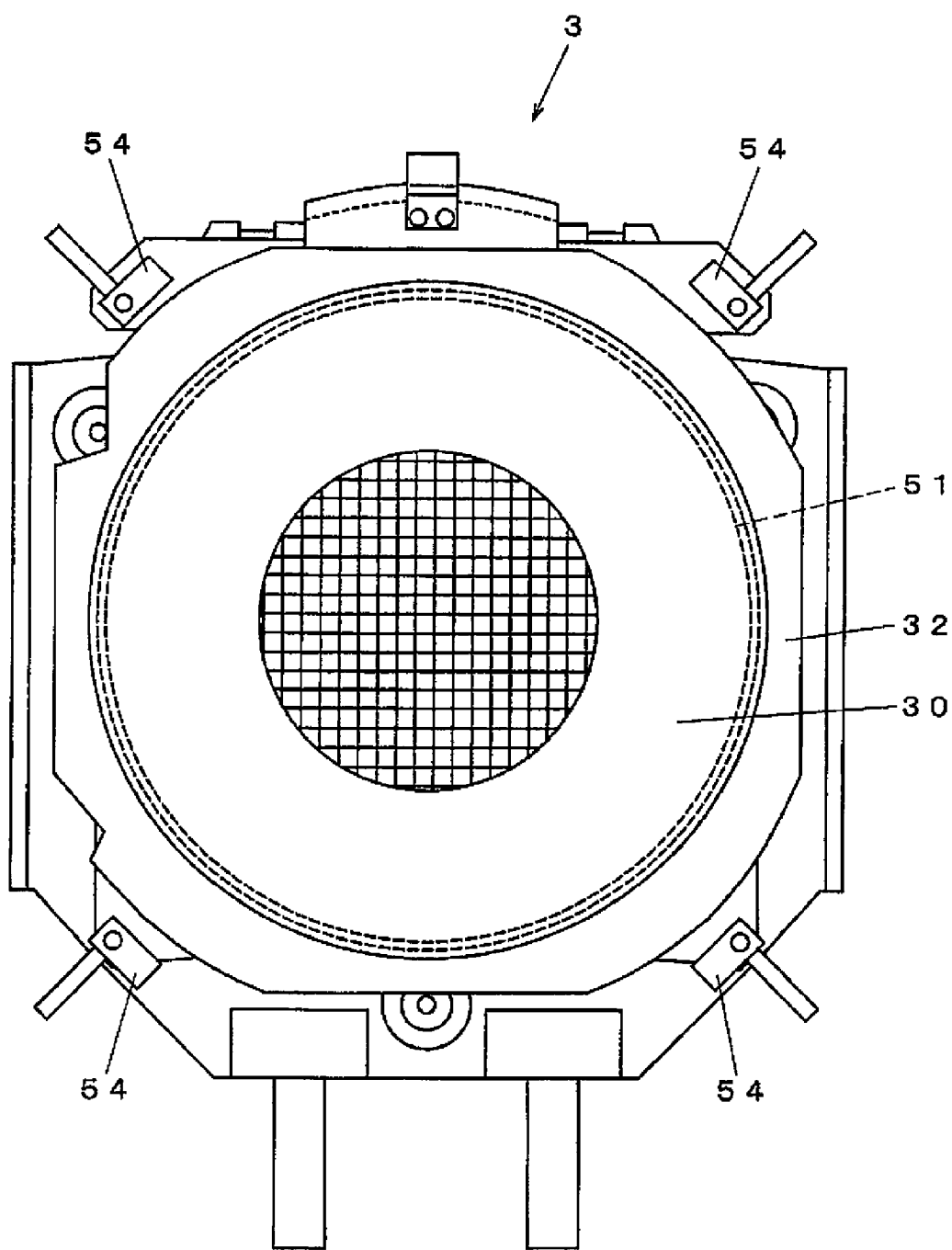
FIG. 11 is an explanatory view showing a method of mounting a ring frame to a chip supply pallet.
Figure 12:
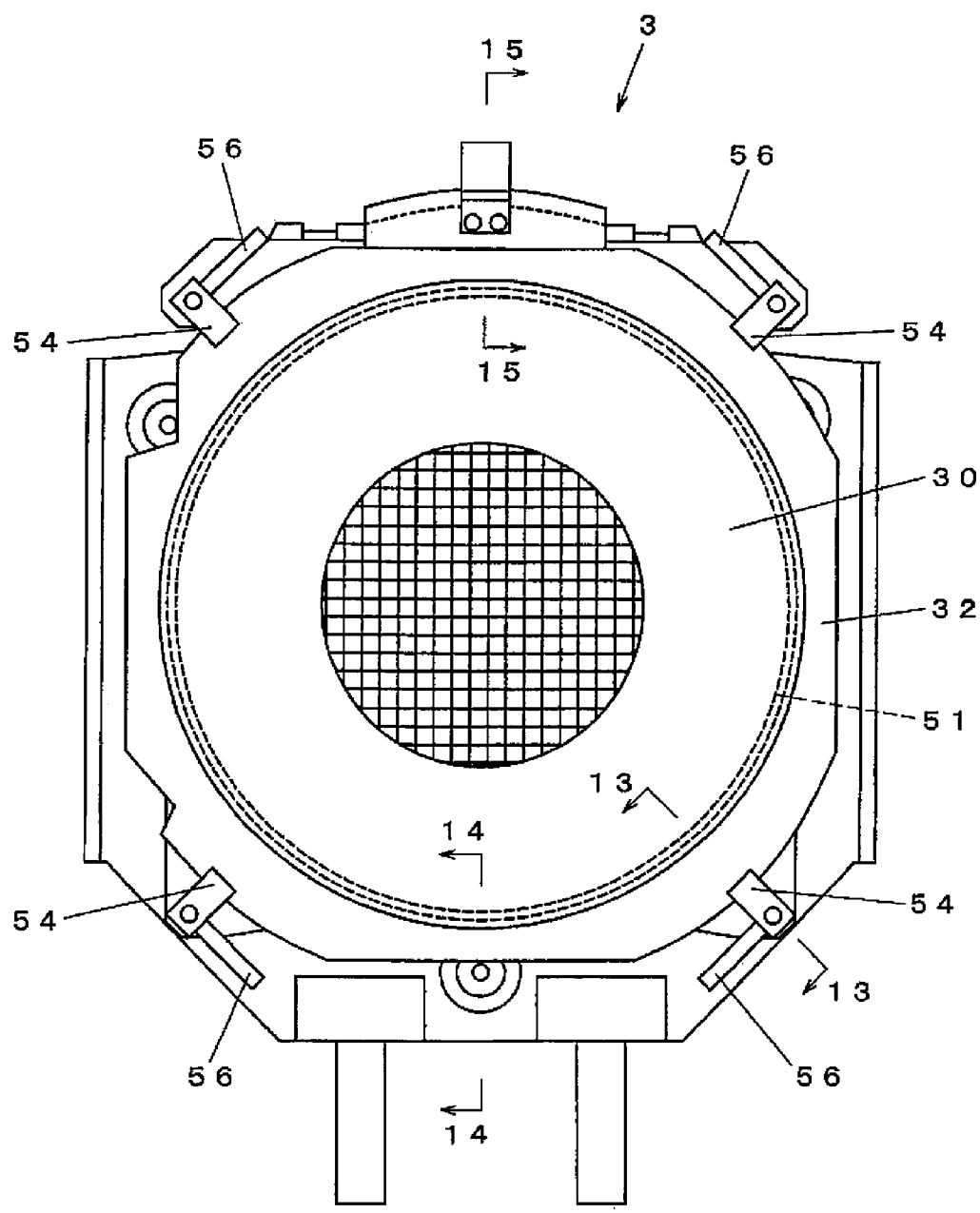
FIG. 12 is an explanatory view showing the method of mounting the ring frame to the chip supply pallet.
Figure 13:
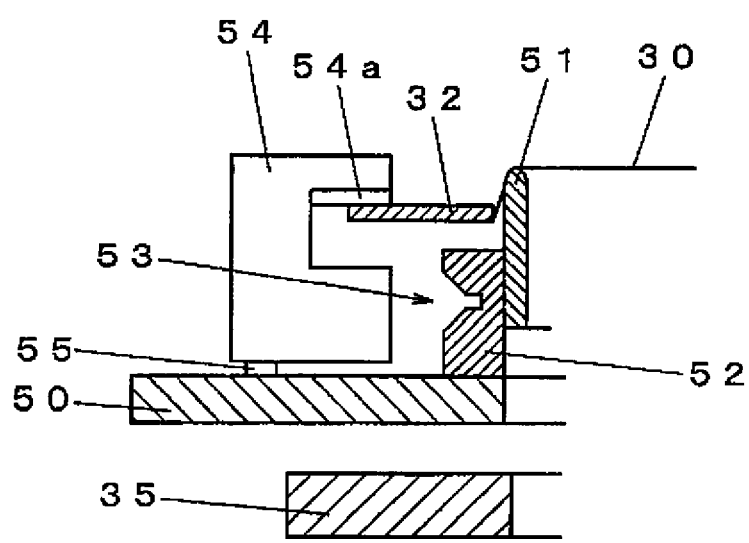
FIG. 13 is a sectional view taken along a section line 13 of FIG. 12.
Figure 14:
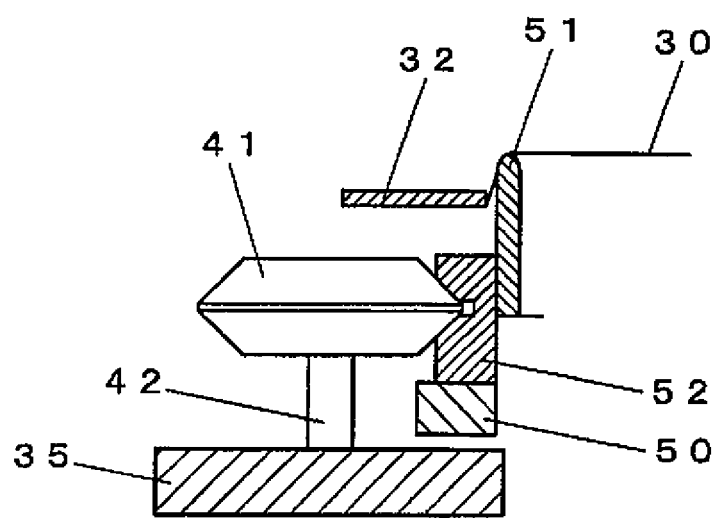
FIG. 14 is a sectional view taken along a section line 14 of FIG. 12.
Figure 15A:
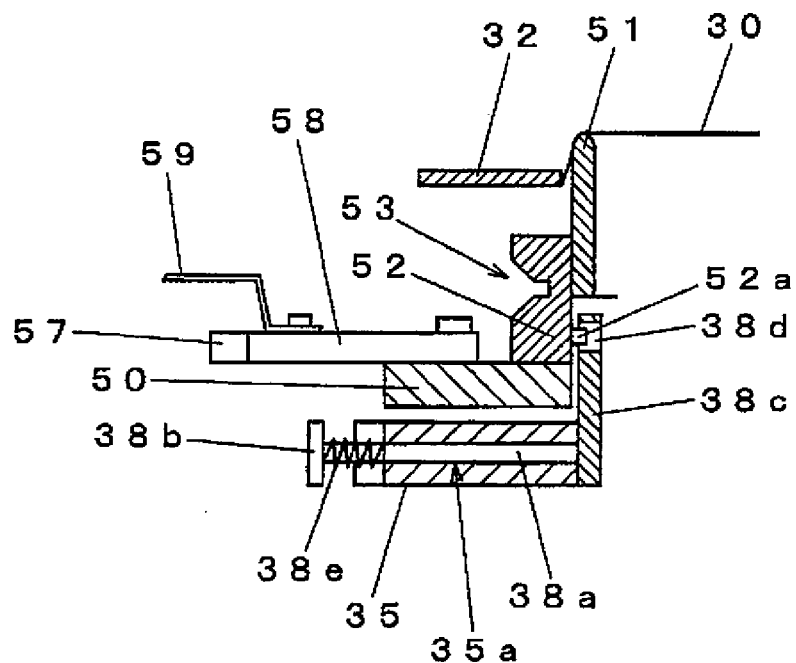
FIGS. 15A and 15B are sectional views taken along a section line 15 of FIG. 12.
Figure 15B:
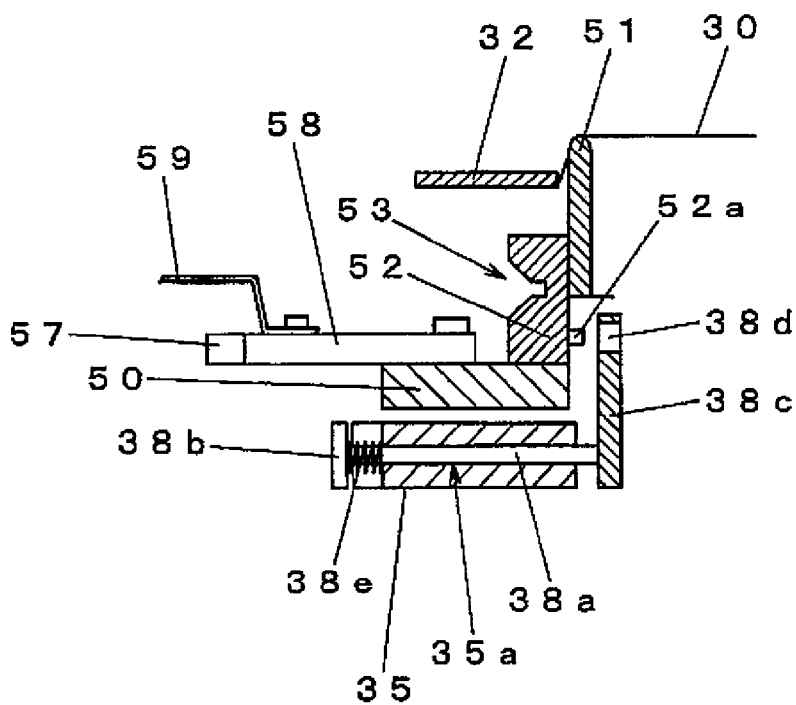
Figure 16:
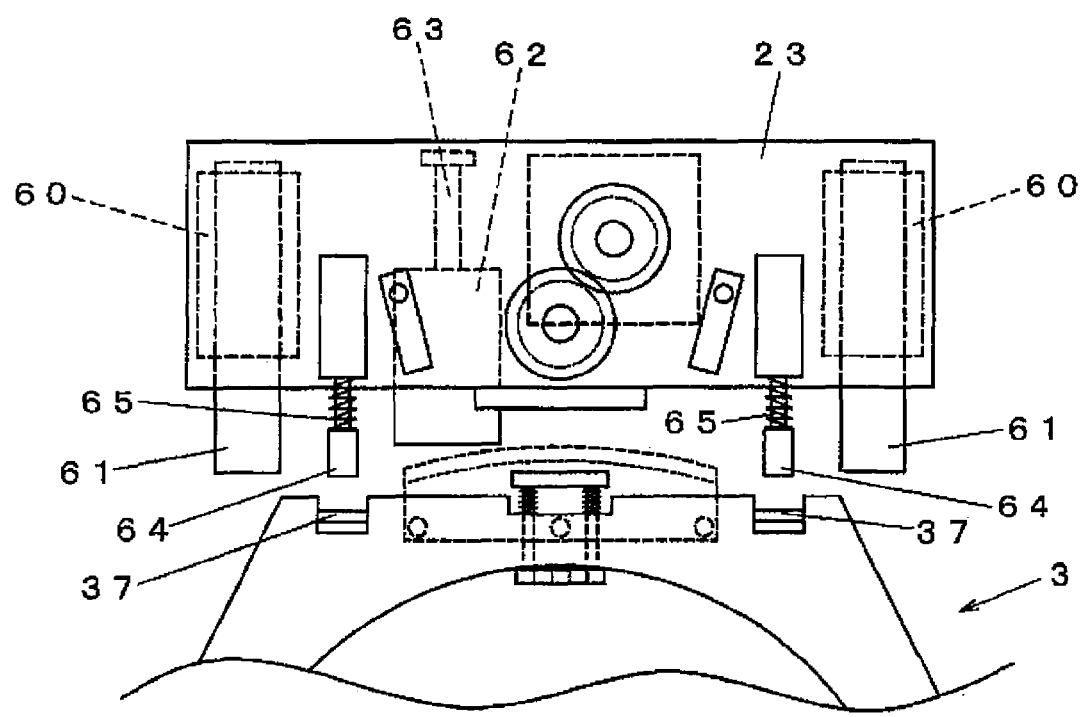
FIG. 16 is an explanatory view showing a method of fixing a chip supply pallet by a pallet-fixing portion.
Figure 17:
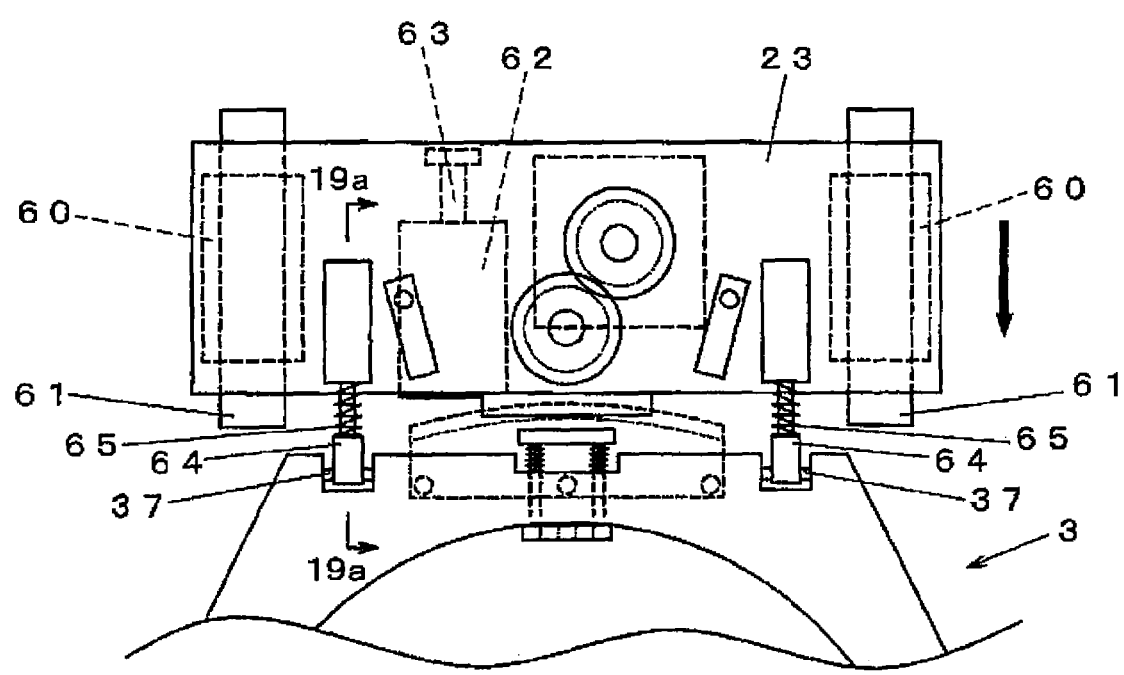
FIG. 17 is an explanatory view showing the method of fixing the chip supply pallet by the pallet-fixing portion.
Figure 19A:
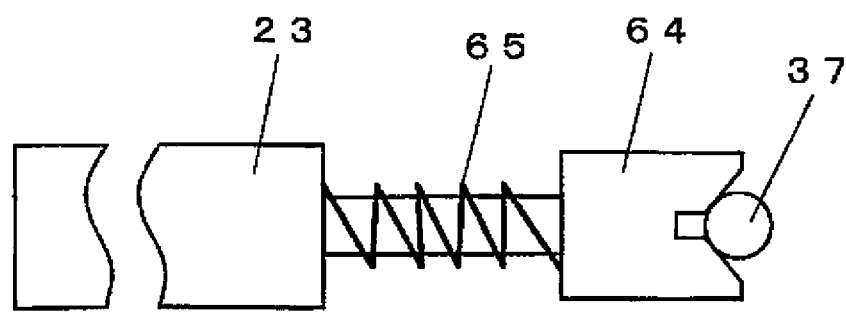
FIG. 19A is a sectional view taken along a section line 19a of FIG. 17
Figure 19B:
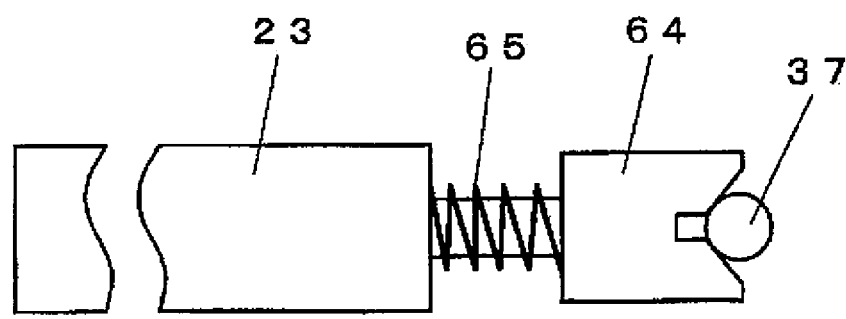
FIG. 19B is a sectional view taken along a section line 19b of FIG. 17.
Figure 20:
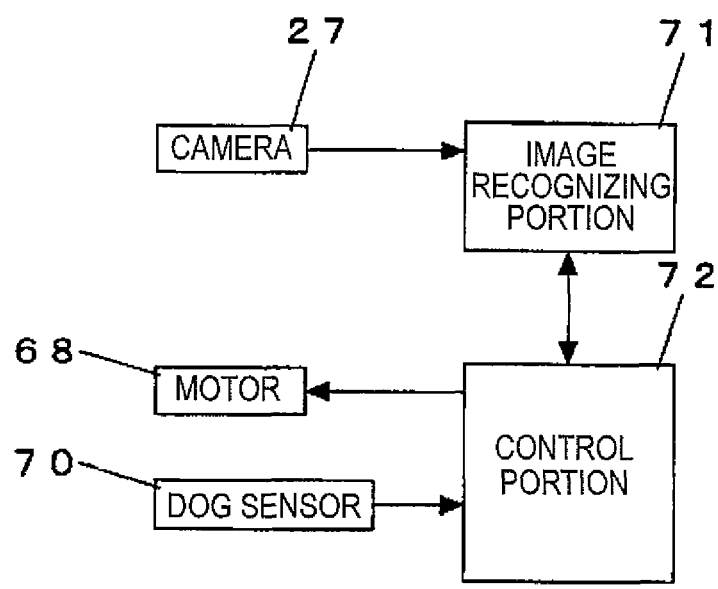
FIG. 20 is a control constitution diagram with regard to a correction of a direction of a chip in the chip supply apparatus according to the embodiment of the invention.
Figure 24:
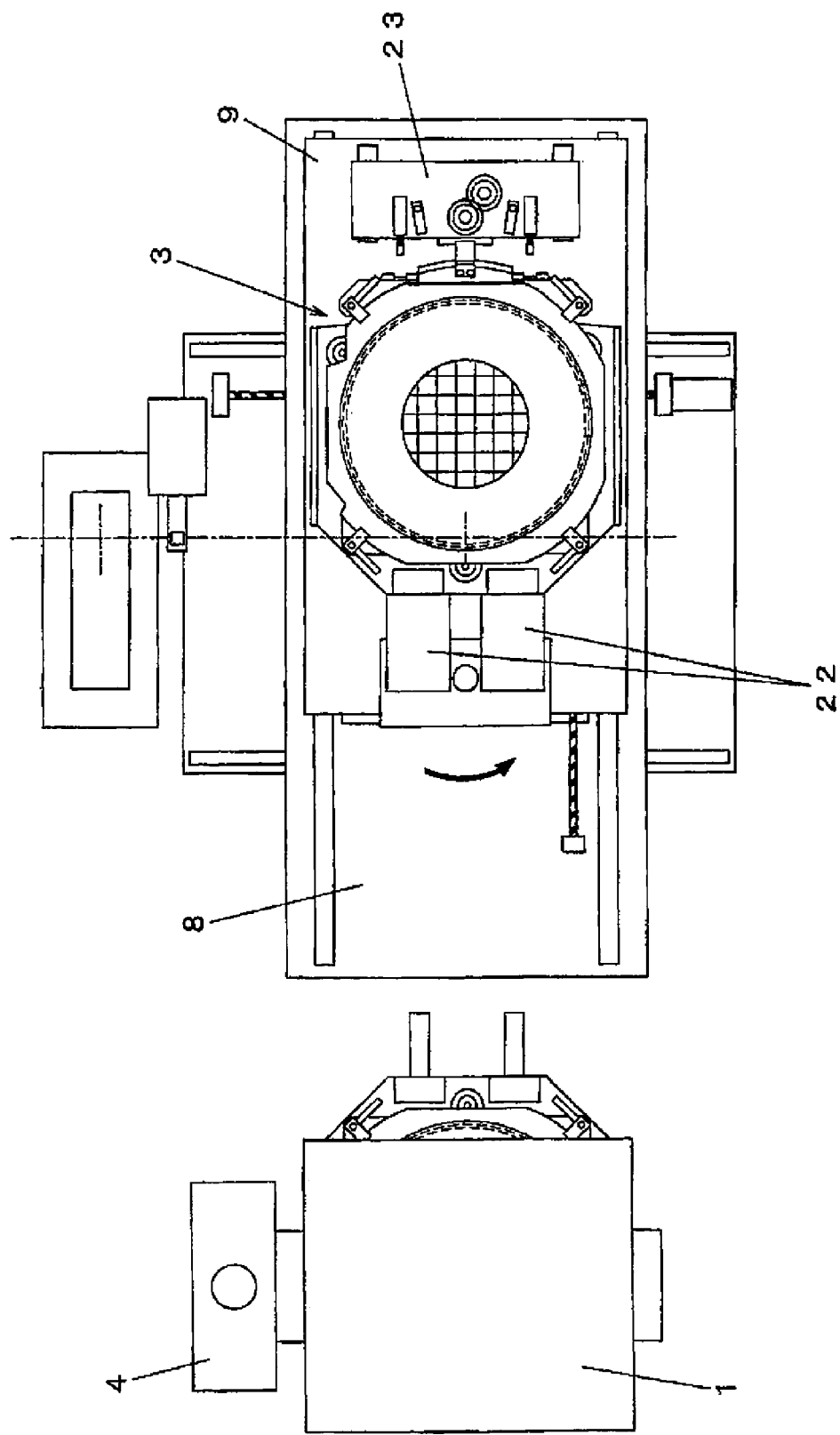
FIG. 24 is an explanatory view of the operation of the chip supply apparatus according to the embodiment of the invention.
Figure 25:
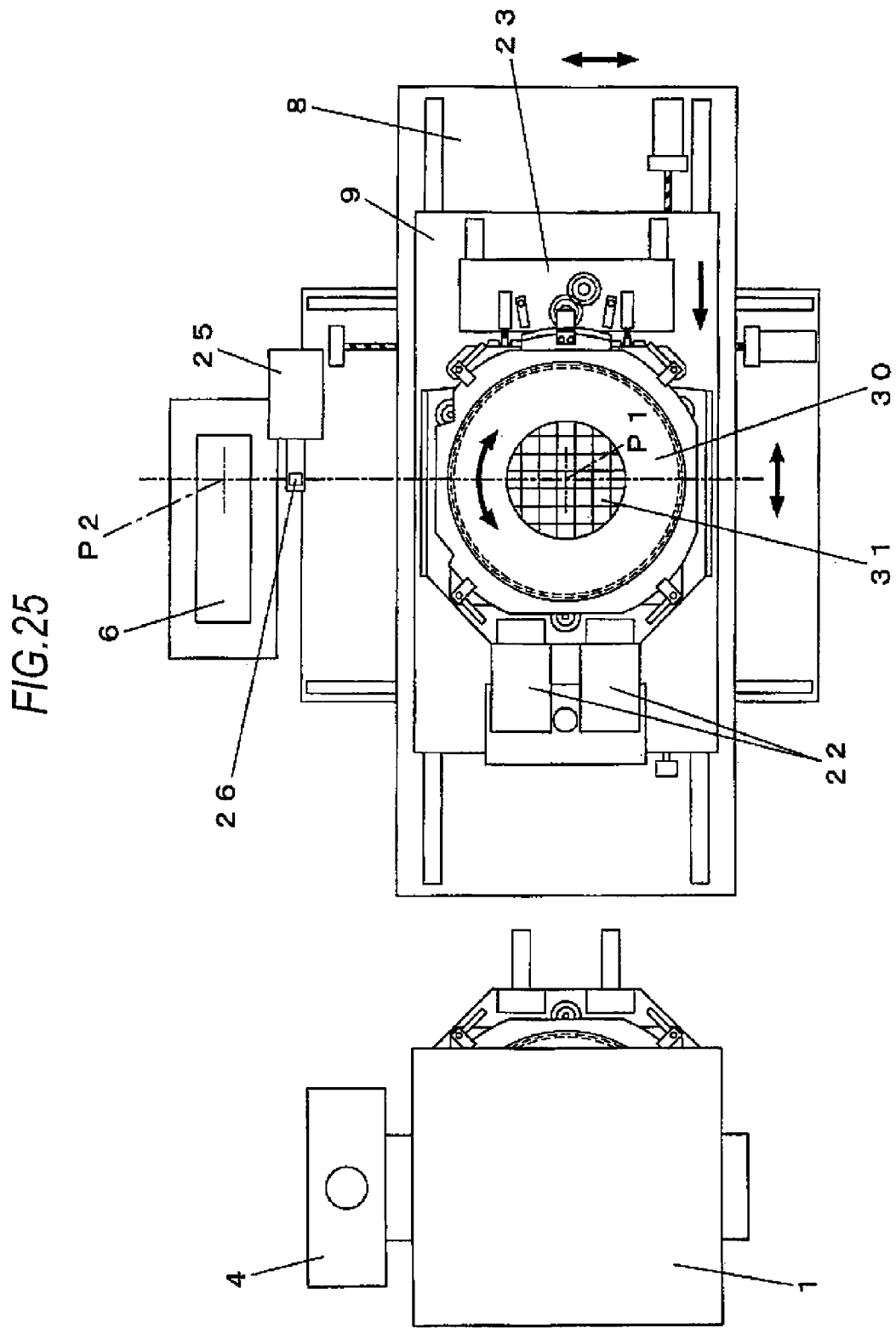
FIG. 25 is an explanatory view of the operation of the chip supply apparatus according to the embodiment of the invention.
Figure 26:
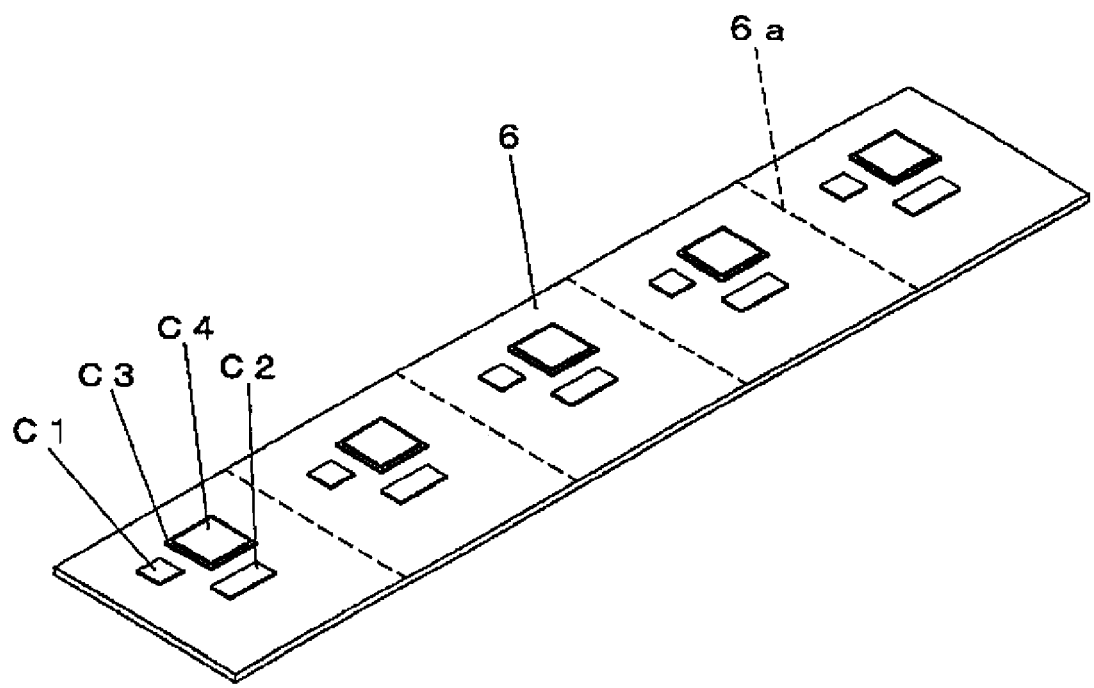
FIG. 26 is a perspective view of a multi-faces taking board.

An embodiment of the invention will be explained in reference to the drawings. FIG. 1 is a plane view of a chip supply apparatus according to an embodiment of the invention, FIG. 2 is a side view of the chip supply apparatus according to the embodiment of the invention, FIG. 3 is a plane view of a wafer sheet and a ring frame according to the embodiment of the invention, FIG. 4 is a plane view of a chip supply pallet according to the embodiment of the invention, FIG. 5 is a side view of the chip supply pallet according to the embodiment of the invention, FIG. 6 is a front view of the chip supply pallet according to the embodiment of the invention, FIG. 7 is a rear view of the chip supply pallet according to the embodiment of the invention, FIG. 8 is a plane view of a second member according to the embodiment of the invention, FIG. 9 is a side view of an inner structure of a magazine according to the embodiment of the invention, FIG. 10 is a plane view of a first member according to the embodiment of the invention, FIG. 11 and FIG. 12 are explanatory views showing a method of mounting a ring frame to the chip supply pallet, FIG. 13 is a sectional view taken along a section line 13 of FIG. 12, FIG. 14 is a sectional view taken along a section line 14 of FIG. 12, FIGS. 15A and 15B are sectional views taken along a section line 15 of FIG. 12, FIG. 16, FIG. 17 and FIG. 18 are explanatory views showing a method of fixing the chip supply pallet by a pallet fixing portion, FIG. 19A is a sectional view taken along a section line 19a of FIG. 17, FIG. 19B is a sectional view taken along a section line 19b of FIG. 17, FIG. 20 is a control constitution diagram with regard to a correction of a direction of a chip in the chip supply apparatus according to the embodiment of the invention, FIG. 21 through FIG. 25 are explanatory views of an operation of the chip supply apparatus according to the embodiment of the invention, and FIG. 26 is a perspective view of a multi-faces taking board.

A configuration of a chip supply apparatus will be explained in reference to FIG. 1 and FIG. 2. A magazine 1 is a pallet containing portion including a plurality of containing chambers 2 partitioned in an up and down direction, and containing chip supply pallets (hereinafter, abbreviated as pallet) 3 to the respective containing chambers 2 one by one. According to the magazine 1, one of side faces is opened and the pallet 3 can be made to go in and come out thereto and therefrom. A lift apparatus 4 positions all of the pallets 3 contained in the magazine 1 to a predetermined pallet interchanging height by moving the magazine in the up and down direction.

A chip bonder 5 is configured by a chip transfer apparatus for mounting a chip onto a board 6, and a chip supply apparatus of supplying a chip to the chip transfer apparatus. The chip supply apparatus of the chip bonder 5 is arranged at a position opposed to the opened side face of the magazine 1. The board 6 is supported by a first table 7 movably in a horizontal direction. The pallet 3 is supported by a second table 8 and a third table 9 movable in Y direction and X direction orthogonal to each other movably in the horizontal direction. The second table 8 is fixed to a slider 12 slidably mounted to a rail 11 fixed to a base 10 on a back face side thereof. The base 10 is arranged with a feed screw 13 constituting a feed direction by a direction of elongating the rail 11 along with a motor 14 and a nut 15 screwed to the feed screw 13 is fixed on a back face side of the second table 8. By the constitution, the second table 8 is horizontally moved in directions of being proximate to and remote from the first table 7 (Y direction) by driving to rotate regularly and rotate reversely the motor 14.

The third table 9 is fixed to a slider 17 slidably fitted to a rail 16 fixed to a side of a surface of the second table 8 on a back face side thereof. The second table 8 is arranged with a feed screw 18 constituting a feed direction by a direction of elongating the rail 16, and a nut 20 screwed to the feed screw 18 is fixed to a back face side of the third table 9. By the constitution, the third table 9 is horizontally moved in a direction of being proximate to and remote from the opened side face of the magazine 1 (X direction) by driving to rotate regularly and rotate reversely a motor 19.

A pallet turn mechanism provided on a side of the magazine 1 of the third table 9 is configured by a rotation actuator 21 fixed to the third table 9 and a pallet holding portion 22 axially supported thereto to be able to turn horizontally. The pallet holding portion 22 can hold electromagnetically or mechanically a held portion formed at an edge portion of the pallet 3. The pallet holding portion 22 changes a direction of the pallet 3 by being turned horizontally in a state of holding the supported portion.

A pallet fixing mechanism arranged on a side of being opposed to the pallet turning mechanism by interposing an opening 9a formed at a center of the third table 9 is configured by a straight moving actuator and a pallet fixing portion 23 fixed to the third table 9. The pallet fixing portion 23 presses a fixed portion formed at an edge portion opposed to the supported portion of the pallet 3 and fixes the pallet 3 at a predetermined position above the third table 9.

A transfer head 25 is a chip transfer apparatus of mounting the chip supplied from the pallet 3 onto the board 6. The transfer head 25 picks up the chip from the pallet 3 fixed onto the third table 9 at a pick up position P1 and mounts the chip on the board 6 at a mounting position P2. The pick up position P1 and the mounting position P2 are fixed, and therefore, when the chip is picked up from the pallet 3, an arbitrary one of the chip is positioned at the pick up position P1 by horizontally moving the pallet 3 by controlling to drive the motors 14, 19. Similarly, an arbitrary chip-mounting portion of the board 6 is positioned at the mounting position P2 by controlling the horizontal position of the first table 7. The transfer head 25 is mounted with a nozzle 26 movable in the up and down direction, and the nozzle 26 picks up the chip and mounts the chip onto the board 6.

A camera 27 is arranged on a vertical line of the pick up position P1. The camera 27 constitutes a field of view of image taking by a lower side in the vertical direction, and takes the image of the chip disposed at the pallet 3. A chip push up mechanism 28 pushes up a pin (not illustrated) to an upper side from an ejector 29 on the vertical line of the pick up position P1 to push up the chip disposed at the pallet 3 from a lower side to the nozzle 26. The chip push up mechanism 28 is arranged at inside of an opening 8a of the second table 8. Further, also a center of the third table 9 is provided with an opening 9a for passing the pin projected from the ejector 29.

A constitution of the pallet will be explained in reference to FIG. 3 through FIG. 10. FIG. 3 shows a ring frame holding a wafer sheet on an inner side thereof. A surface of a wafer sheet 30 having an adhering property is pasted with a semiconductor wafer formed into individual pieces of a plurality of chips 31. The wafer sheet 30 is held by a ring frame 32 at a position of surrounding portions pasted with the chips 31. The ring frame 32 is a rigid member having an opening in a circular shape on an inner side thereof and holds the wafer sheet 30 having a flexible property and an elongatable and contractable property to a degree of not being bent on the inner side.

FIG. 4 through FIG. 7 respectively show a plane view, a side view, a front view, and a rear view of the pallet (not mounted with wafer sheet). The pallet 3 is overlapped with a first member 33 and a second member 34 and is configured to be able to rotationally displace the first member 33 relative to the second member 34. Among them, only the second member is shown in FIG. 8. By mounting a number of parts on the basis of a main member 35, the second member 34 is configured. The main member 35 is a plate-like member a center of which is opened in a circular shape. A front portion of the main member 35 is mounted with a held portion 36 directly fixed by the pallet-holding portion 22 arranged at the third table 9. Further, a rear portion thereof is provided with a fixed portion 37 directly fixed by the pallet fixing portion 23, and a lock mechanism 38 restricting a rotational displacement of the first member 33 relative to the second member 34. Further, both side portions thereof are formed with slide portions 39 serving as a guide when the pallet 3 is made to come in and go out to and from the magazine 1. As shown by FIG. 9, inside of the magazine 1 is partitioned into the plurality of containing chambers 2 in an up and down direction, and the pallets 3 are contained one by one in the respective containing chambers 2 in a state of mounting the slide portions 39 on projections 40 formed at an inner wall of the magazine 1. The upper portion of the main member 35 is mounted with three rollers 41 at positions surrounding the opening portion. The rollers 41 are rotatable centering on shafts 42 arranged at equal distances from the opening center O1 respectively at the same intervals.

FIG. 10 shows only the first member, by mounting a number of parts on the basis of a main member 50, the first member 33 is configured. The main member 50 is a plate-like member a center of which is opened in a circular shape. The upper portion of the main member 50 is mounted with a hollow tension ring 51 having an outer diameter smaller than an inner diameter of the ring frame 32. An opening center O2 of the tension ring 51 and an opening center O3 of the main member 50 are disposed on the same vertical line. An outer peripheral side of the tension ring 51 is mounted with a ring-like member 52 having a larger diameter. An outer peripheral face of the ring-like member 52 is formed with a groove 53 fitted with outer peripheries of the three rollers 41 mounted to the second member 34. As shown by FIG. 4 through FIG. 7, the first member 33 is supported on the second member 34 only by the three rollers 41 fitted to the groove 53, and is made to be able to rotationally displace relative to the second member 34 by constituting a center of rotation by the centers O1, O2, O3 disposed on the same linear line of circle.

Further, the upper portion of the main member 50 is mounted with four fixing members 54 at positions surrounding the ring-like member 52. By rotational displacing the fixing members 54 centering on shafts 55 arranged at equal distances from the opening center O3 respectively at the same intervals, an attitude thereof can be changed to a fixing attitude of fixing the ring frame 32 to the pallet 3 and an escaping attitude of not inferring with the ring frame 32 for attaching and detaching the ring frame 32 to and from the pallet 3.

The respective fixing members 54 are mounted with levers 56 for touching the finger or the like, and a person (operator) of attaching and detaching the ring frame 32 to and from the pallet 3 changes the attitude of the fixing member 54 by using the lever 56. A center of a rear portion of the main member 50 is mounted with a member 58 formed with a driven gear 57 in a state of projecting the driven gear 57 to a rear side. The member 58 is mounted with a dog 59 projected to a further rear side of the driven gear 57.

A method of mounting the ring frame 32 to the pallet 3 will be explained in reference to FIG. 11 through FIG. 14. The operator confirms that all of the fixing members 54 are brought into the escaping attitude, mounts the wafer sheet 30 on an upper end of the tension ring 51 such that a circular inner peripheral edge of the ring frame 32 and the tension ring 51 are brought into a positional relationship of concentric circles (FIG. 11), and changes an attitude of the fixing member 54 from the escaping attitude to the fixing attitude by moving the lever 56 (FIG. 12). By the series operation, the ring frame 32 is fixed by the four fixing members 54 to be mounted to the pallet 3.

FIG. 13 shows a sectional view taken along a section line 13 of FIG. 12. An inclined face 54a is provided at a portion of bringing the fixing member 54 into contact with the ring frame 32. The inclined face 54a serves to be brought into contact with the ring frame 32 to push down to a lower side along an inclination when the fixing member 54 changes the attitude from the escaping attitude to the fixing attitude. When the fixing member 54 changes the attitude to the fixing attitude, the ring frame 32 is fixed on a lower side of the upper end of the tension ring 51, and the wafer sheet 30 is brought into the state of being pulled to extend on an inner side of the tension ring 51 brought into contact therewith from the lower side. The interval between the chips 31 pasted on the upper face is widened, by pulling to extend the wafer sheet 30, and therefore, an arbitrary one of the chip can easily be picked up.

FIG. 14 shows a sectional view taken along a section line 14 of FIG. 12. The roller 41 mounted to the main member 35 of the second member supports the first member to be able to displace rotationally on an upper side of the second member by being fitted to a groove formed at an outer peripheral face of the ring-like member 52. The first member is mounted with the wafer sheet 30 in a state of being pulled to extend, and therefore, a direction of the chip pasted onto the wafer sheet 30 can be changed relative to the second member.

An explanation will be given of restricting unit for restricting a relative rotational displacement of the first member and the second member in reference to FIGS. 15A and 15B. FIGS. 15A and 15B are sectional views taken along a section line 15 of FIG. 12. The main member 35 of the second member is formed with a hole 35a penetrating from an outer peripheral face to an inner peripheral face thereof. The hole 35a is inserted with a connecting member 38a longer than a total length of the hole 35a, a side of the outer peripheral face of the main member 35 of the connecting member 38a is attached with an operating member 38b, and a side of the inner peripheral face thereof is attached with a driven member 38c, respectively. An upper end of the driven member 38c is extended to a height opposed to a side of an inner peripheral face of the ring-like member 52, and a lock hole 38d formed at a vicinity of the upper end is made to be able to be engaged with a lock pin 52a attached to a side of an inner peripheral face of the ring-like member 52. A compression spring 38e is interposed between the operating member 38b and the main member 35, the driven member 38c is urged in a direction of being proximate to the side of the inner peripheral face of the ring-like member 52 by an elastic force of the compression spring 38e, and the lock hole 38d is brought into a state of being engaged with the lock pin 52a (FIG. 15A). Under the state, when the first member is going to be rotated relative to the second member, by bringing the lock pin 52a into contact with an edge of the lock hole 38d, the rotational displacement is restricted.

In a case of releasing the rotational displacement from being restricted, when the operating member 38b is pressed to a side of the main member 35 against the elastic force of the compression spring 38e, the driven member 38c is moved in a direction of being remote from the inner peripheral face of the ring-like member 52, the lock pin 52a and the lock hole 38d are released from being engaged with each other, and the relative rotational displacement of the first member and the second member 34 is ensured.

A method of fixing the pallet to the chip supply apparatus will be explained in reference to FIG. 16 through FIGS. 19A and 19B. The pallet fixing portion 23 is mounted to a rail 61 attached to a side of a surface of the third table 9 by way of the slider 60 attached to a back face side thereof slidably in X direction (refer to FIG. 1). The pallet fixing portion 23 is made to be able to move in X direction by an operation of elongating and contracting a rod 63 of a straight moving actuator 62 attached to the third table 9. Two fixing members 64 of the pallet-fixing portion 23 are urged to a side of the pallet 3 by compression springs 65. The fixing members 64 engage with the two fixed portions 37 provided at the second member in the form of being squeezed respectively from upper and lower sides to fix from the rear side of the pallet 3. At this occasion, the held portion 36 provided on a side of being opposed to the fixed portion 37 is held by the pallet holding portion 22, and the pallet 3 is brought into a state of being fixed from the front side by the pallet holding portion 22. When the pallet 3 is fixed, the pallet-fixing portion 23 is made to continue moving even after having been brought into contact with the fixed portion 37 and brings the fixing member 64 into a state of being pressed to the fixed portion 37 by utilizing the elastic force of the compression spring 65.

Figure 18:
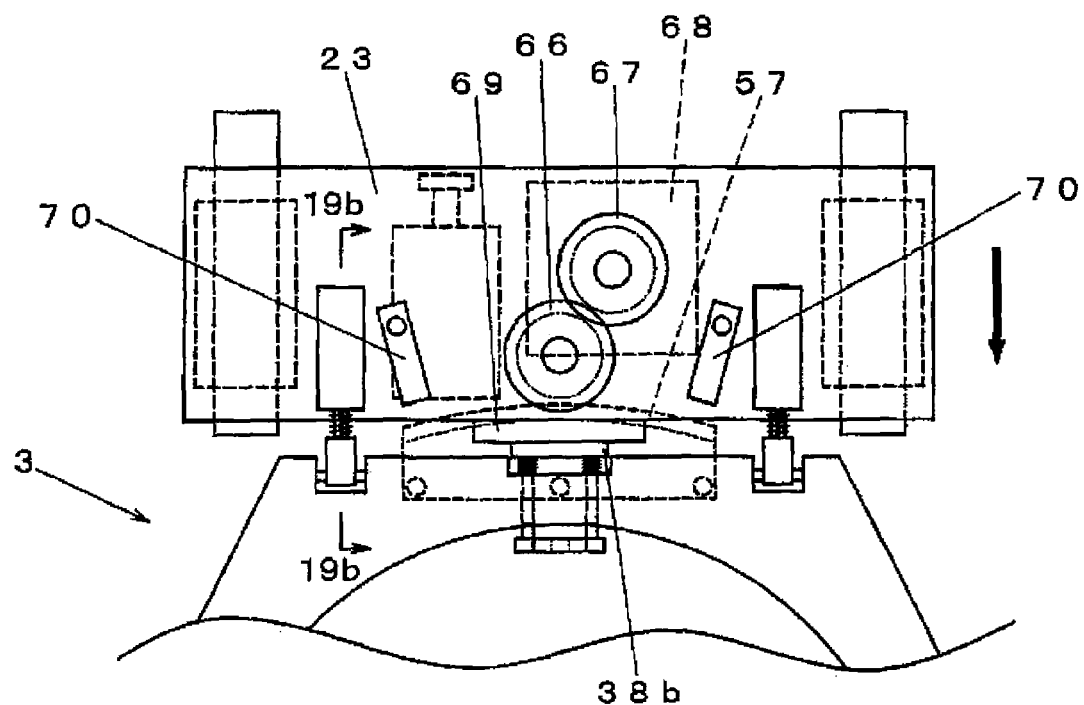
FIG. 18 is an explanatory view showing the method of fixing the chip supply pallet by the pallet-fixing portion.

A method of providing a rotational displacement to the first member of the fixed pallet in reference to FIG. 18. The pallet fixing portion 23 includes a main gear 66 brought in mesh with the driven gear 57 of the first member in fixing the pallet, a drive gear 67 for transmitting rotation to the main gear 66, and a motor 68 of rotating the drive gear 67. A side of the pallet 3 of the pallet fixing portion 23 is provided with a member 69 at a portion opposed to the operating member 38b to function as a restriction releasing unit for releasing the restriction of the rotational displacement of the first member relative to the second member by being brought into contact with the operating member 38b to press in fixing the pallet. When the restriction is released thereby, a rotation drive force of the main gear 66 can be transmitted to the first member by way of the driven gear 57 and the first member is made to be able to be displaced rotationally (refer to FIG. 10). The main gear 66 brought in mesh with the driven gear 57, the drive gear 67 for transmitting rotation to the main gear 66, the motor 68 of rotating the drive gear 67 constitute a rotational drive force providing unit for providing the rotational drive force to the first member.

In FIG. 10, the first member 33 is provided with the dog 59 and in accordance with the rotational displacement of the first member 33, is also the dog 59 is moved. The pallet-fixing portion 23 is provided with a pair of dog sensors 70 of detecting the dog 59 to monitor such that the rotational displacement of the first member is converged into predetermined range.

A control constitution of correcting the direction of the chip will be explained in reference to FIG. 20. An operation of mounting the wafer sheet 30 pasted with the chip to the pallet 3 is carried out manually, and therefore, a dispersion is frequently brought about in a position or angle of mounting for the respective pallets, and there is brought about a situation in which even when the pallet per se is fixed to the same predetermined position, the direction of the chip differs. Therefore, when the chip is picked up by the nozzle 26, first, the image of the chip is taken by the camera 27, image data thereof is transmitted to the image recognizing portion 71 to confirm the portion and direction of the chip. By the image recognizing portion 71, the direction and the position can be confirmed based on the image of single member of the chip and the positions and the directions of individual chips can also be confirmed based on the image of lines formed among the plurality of chips, the camera 27 and the image recognizing portion 71 of confirming the direction of the chip based on the taken image constitute a chip confirming unit.

A control portion 72 calculates a rotation angle of the first member necessary for correcting to a proper direction based on the position and the direction of the chip confirmed by the image-recognizing portion 71 and transmits an instruction to the motor 68. The dog sensor 70 transmits a detecting signal to the control portion 72 when the dog 59 is detected, and the control portion 72 receiving the detecting signal transmits an instruction to stop rotation to the motor 68. Thereby, overrunning of the first member can be prevented.

Figure 21:
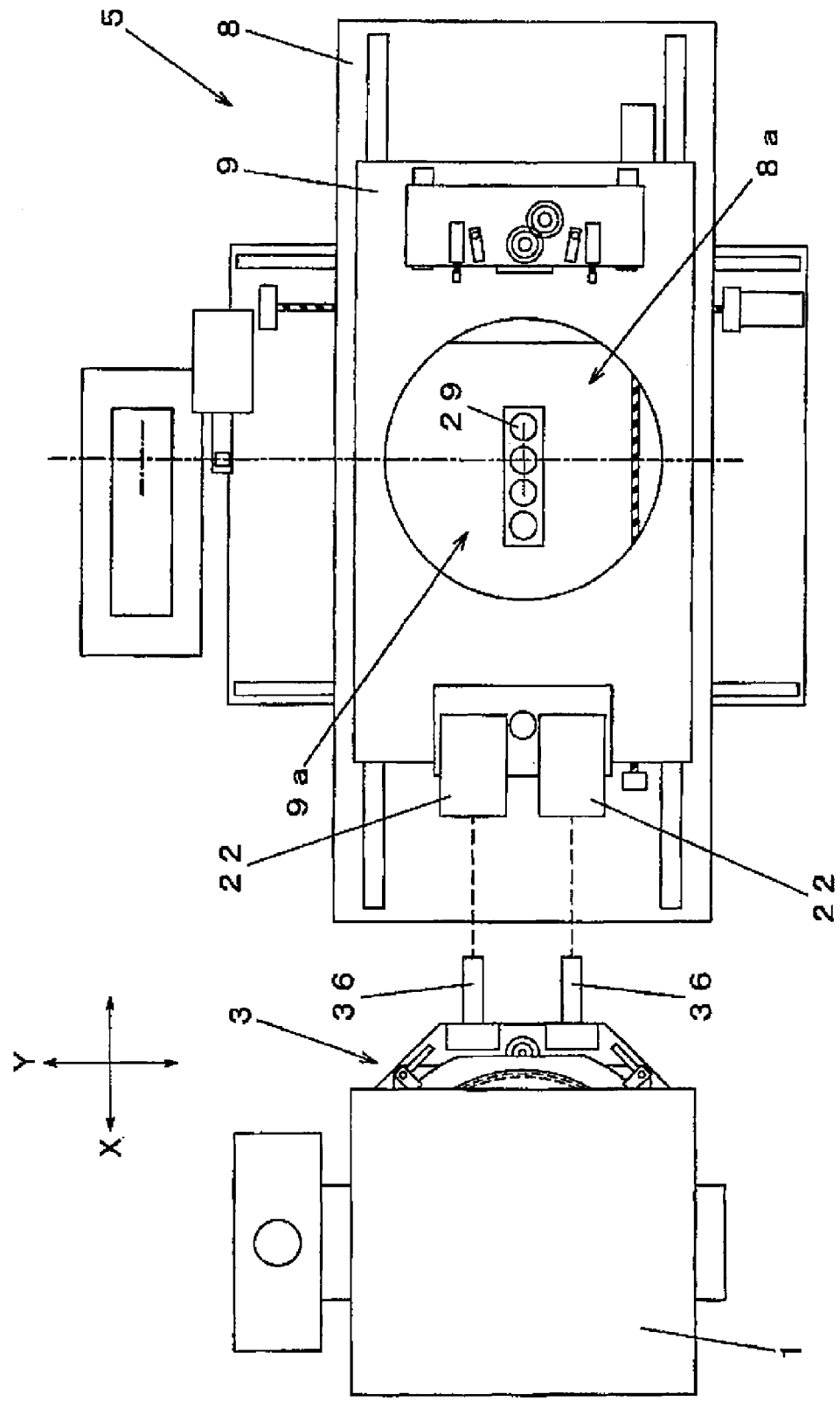
FIG. 21 is an explanatory of an operation of the chip supply apparatus according to the embodiment of the invention.

A procedure of mounting the pallet to the chip bonder will be explained in reference to FIG. 21 through FIG. 26. The pallet 3 mounted to the chip bonder 5 is contained in the magazine 1 in the attitude of directing the held portion 36 to the side of the chip bonder 5. FIG. 21 shows a state in which the pallet holding portion 22 is directed to the side of magazine 1 by turning and horizontal movement (Y direction) of the second table 8 and is disposed in front of the held portion 36. The height of the magazine 1 is adjusted by the lifting apparatus 4 such that the pallet 3 is disposed at a predetermined pallet interchanging height. The chip bonder 5 is not mounted with the pallet yet, and therefore, the ejector 29 can optically be confirmed from the upper side of the chip bonder 5 through the opening 9a of the third table 9 and the opening 8a of the second table 8.

Figure 22:
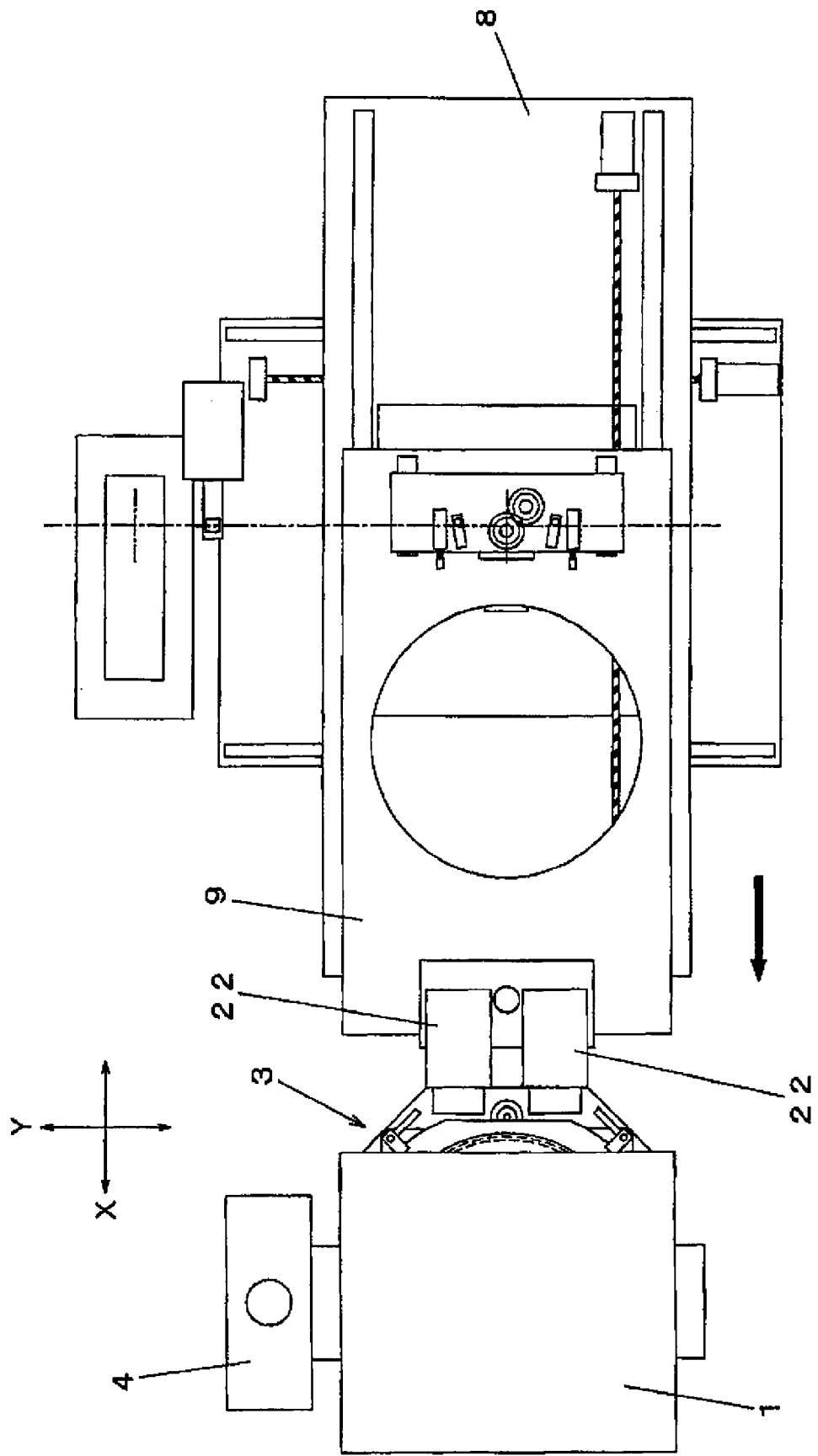
FIG. 22 is an explanatory view of an operation of the chip supply apparatus according to the embodiment of the invention.
Figure 23:
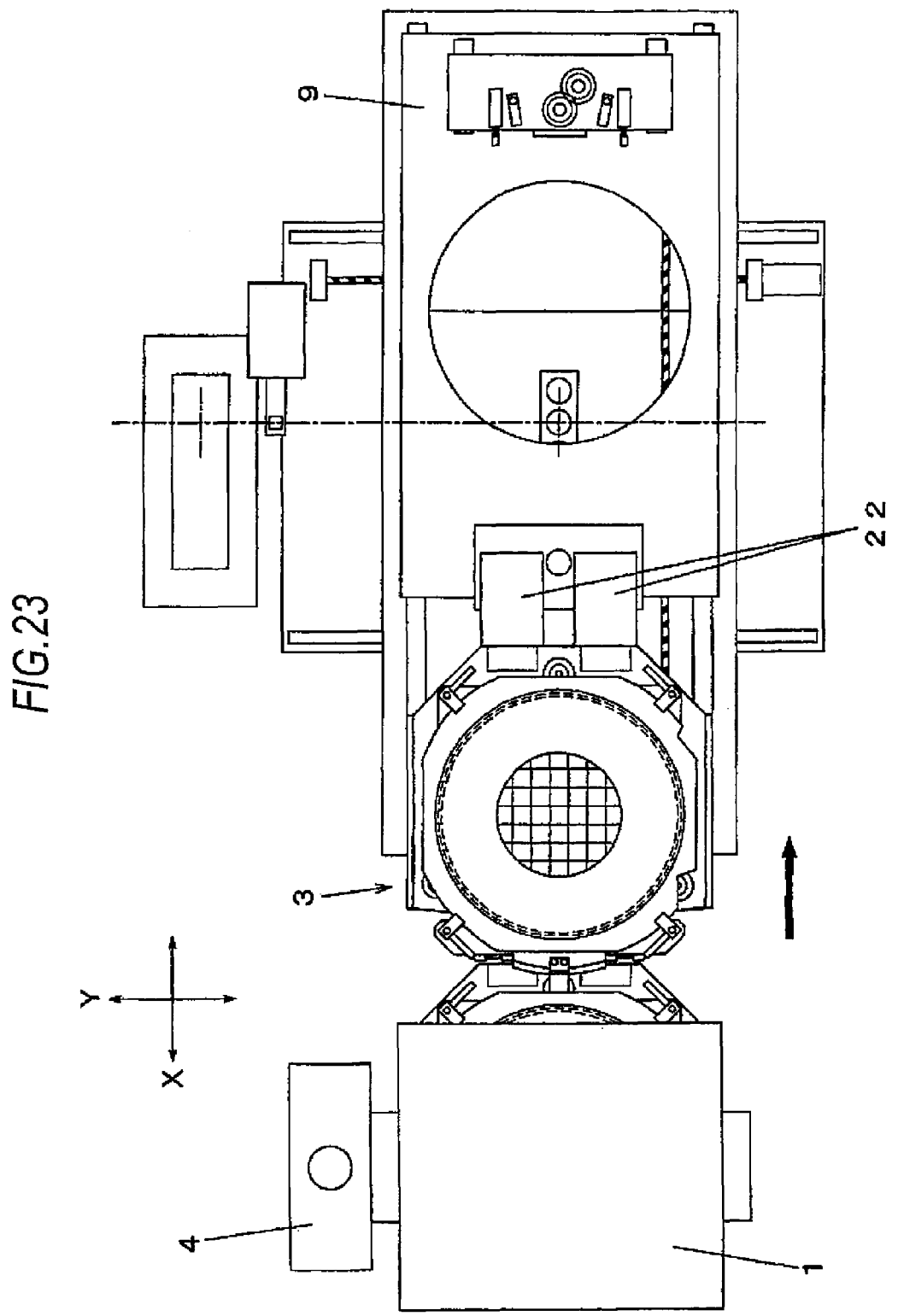
FIG. 23 is an explanatory view of the operation of the chip supply apparatus according to the embodiment of the invention.

FIG. 22 shows a state of moving the pallet-holding portion 22 to the side of the magazine 1 by the horizontal movement (X direction) of the third table 9 and holding the held portion 36 of the pallet 3 contained in the magazine 1. When the pallet holding portion 22 holds the held portion 36, as shown by FIG. 23, the third table 9 is horizontally moved (X direction) at this occasion in a reverse direction and the pallet 3 is taken out from the magazine 1. When the pallet 3 is completely pulled out from the magazine 1, as shown by FIG. 24, the pallet holding portion 22 is turned by 180 degrees to change the direction of the pallet 3 to be disposed right above the opening of the third table 9. Further, as shown by FIG. 25, the pallet-fixing portion 23 is moved and the pallet 3 is fixed. As described previously, by fixing the pallet 3, the lock is released, the first member can be displaced rotationally relative to the second member, and therefore, the direction of the chip 31 pasted onto the wafer sheet 30 mounted to the first member can freely be changed.

In FIG. 25, the plurality of chips on the third table 9 are successively positioned to the pick up position P1 by the second table 8 and the third table 9 horizontally moved in directions orthogonal to each other (XY directions). The third table 9 is provided with not only a function of positioning the arbitrary chip at the pick up position P1 of the chip bonder 5 in cooperation with the second table 8 but a function of making the pallet 3 come to and pull out from the magazine 1 as described previously. The direction of the chip 31 positioned to the pick up position P1 is confirmed and the direction is corrected when there is a deviation relative to a proper direction. The corrected chip 31 is picked up from the wafer sheet 30 by the nozzle 26, transferred to the mounting position P2 by the transfer head 25 and is mounted on the board 6.

FIG. 26 shows a detailed view of the board 6. The board 6 is a multi-faces taking board in which a plurality of small boards are made to be continuous in one line. The board 6 is previously provided with a cut line 6a of partitioning small boards to be able to be divided easily in a later step. Each small board is mounted with respective 4 kinds of chips C1, C2, C3, C4. The 4 kinds of chips are processed by a procedure of first, mounting chips C1 to all of the boards and successively mounting all of small boards by an order of C2, C3, C4. Only 1 kind of chip is pasted on one wafer sheet 30, and therefore, 4 of wafer sheets 30 need to be used when the chips are mounted on the board 6. According to the chip bonder 5, the wafer sheets 30 pasted with the chips C1, C2, C3, C4 are respectively mounted to the pallets 3 to be contained in the magazine 1, and the 4 of the pallets 3 are successively fixed to predetermined positions of the third table 9 to thereby mount the chips C1, C2, C3, C4 onto the board 6.

Further, although the board 6 is the supply object of being supplied with the chip exfoliated from the wafer sheet 30, the supply object of the chip supply apparatus of the invention is not limited to the board using the chip as the part but the supply object may be a case or the like of storing a chip as a product.

The chip bonder 5 interchanges the wafer sheet 30 in a state of being mounted to the pallet 3, and therefore, a state of exerting the tension to the wafer sheet 30 is maintained, and chips remaining in the wafer sheet 30 may not collide with each other by an impact, a vibration or the like in being interchanged. Further, although the wafer sheet 30 is interchanged by interrupting the mounting operation, the wafer sheet 30 is previously mounted to the pallet 3, a time period of mounting and detaching the wafer sheet 30 is not needed in being interchanged, and therefore, an awaiting time period of the mounting operation can be shortened.

Further, a total of the chip bonder can be simplified and downsized in comparison with a method of the background art only by a straight moving mechanism by providing the pallet turning mechanism of changing the direction of the pallet 3 to the direction of containing in the magazine 1 and the direction of setting to the chip bonder 5 at the third table 9 constituting the positioning mechanism and carrying out an operation of interchanging the pallet 3 in cooperation with the mechanisms. Further, the pallet 3 can be turned and horizontally moved in parallel with each other, and therefore, a time period required for interchanging the pallet can be shortened.

The invention is useful particularly in a field of multi-chips bonding of mounting a variety of chips continuously on a board.

The invention claimed is:

1. A chip supply pallet for mounting a wafer sheet pasted with a semiconductor wafer formed into individual pieces of a plurality of chips to a chip supply apparatus in a state of being exerted with a tension, the chip supply pallet comprising:
    a first member having a tension ring brought into contact with the wafer sheet from a lower side of the wafer sheet and a fixing member of fixing a ring frame holding the wafer sheet on an inner side of the ring frame on a lower side of the wafer sheet brought into contact with the tension ring; and
    a second member configured with side portions to mount inside a magazine and having a fixed portion for fixing to a predetermined position of the chip supply apparatus and a held portion of being held when the chip supply pallet is removed from the magazine by the chip supply apparatus; and
    a restricting unit for restricting a relative rotational displacement of the first member and the second member and a restriction releasing unit for releasing the restricting unit;
    wherein the first member is configured to be able to rotationally displace relative to the second member fixed to the predetermined position of the chip supply apparatus,
    wherein the fixing member is rotatable from a fixing position of fixing the ring frame and a releasing position of not interfering with the ring frame for attaching and detaching the ring frame, and
    wherein the fixing member has an inclined face which is directly in contact with the ring frame to push down the ring frame when the fixing member is in the fixing position; and
    wherein the chip supply apparatus comprises:
    a first table which supports a board which is prepared for mounting thereon a chip from a chip supply pallet by a transfer head;
    a second table which is movable horizontally along a Y direction of being proximate to and remote from the first table
    a third table which is movable horizontally along an X direction of being proximate to and remote from an opened side face of the magazine which contains the chip supply pallet, comprising:
    a pallet holding portion which holds the held portion of the chip supply pallet contained in the magazine and which horizontally moves the chip supply pallet along the X direction, thereby taking the chip supply pallet out of the magazine;
    a rotation actuator which axially supports and turns the pallet holding portion by 180 degrees after the chip supply pallet is completely pulled out of the magazine,
    a pallet fixing portion which is arranged to oppose the pallet holding portion and the rotation actuator across an opening formed at a center of the third table such that the chip supply pallet is held from both sides fixing the chip supply pallet on the third table.

2. A chip supply apparatus mounted with the chip supply pallet according to claim 1 and supplying a chip exfoliated from a wafer sheet to a supply object;
    wherein the chip supply pallet is configured by a first member of holding the wafer sheet in a state of exerting a tension thereto and a second member made to be able to rotationally displace relative to the first member, the chip supply apparatus comprising:
    a chip confirming unit for confirming a direction of the chip pasted to the wafer sheet, and a pallet rotational drive force providing unit for providing a rotational drive force to the first member.

3. The chip supply apparatus according to claim 2, wherein the pallet rotational drive force providing unit comprises a main gear brought in mesh with a driven gear provided at the second member, and the main gear and the driven gear are brought in mesh with each other in mounting the chip supply pallet.

4. The chip supply apparatus according to claim 1, wherein the pallet fixing portion is moved by a straight moving actuator along the X direction such that the chip supply pallet is held from both sides in the X direction.

5. A chip supply apparatus comprising:
a first table which supports a board which is prepared for mounting thereon a chip from a chip supply pallet by a transfer head;
a second table which is movable horizontally along a Y direction of being proximate to and remote from the first table; and
a third table which is movable horizontally along an X direction of being proximate to and remote from an opened side face of a magazine which contains the chip supply pallet,
wherein the chip supply pallet mounts a wafer sheet pasted with a semiconductor wafer formed into individual pieces of a plurality of chips to the third table in a state of being exerted with a tension,
wherein the chip supply pallet comprises:
a first member comprising a tension ring brought into contact with the wafer sheet from a lower side of the wafer sheet and a fixing member of fixing a ring frame holding the wafer sheet on an inner side of the ring frame on a lower side of the wafer sheet brought into contact with the tension ring; and
a second member comprising a fixed portion for fixing to a predetermined position of the third table and a held portion of being held when the chip supply pallet is transferred,
wherein the first member is configured to be able to rotationally displace relative to the second member fixed to the predetermined position of the third table, and
wherein the third table comprises:
a pallet holding portion which holds the held portion of the chip supply pallet contained in the magazine and which horizontally moves the chip supply pallet along the X direction, thereby taking the chip supply pallet out from the magazine;
a rotation actuator which turns the pallet holding portion by 180 degrees after the chip supply pallet is completely pulled out from the magazine; and
a pallet fixing portion which is arranged to oppose the pallet holding portion and the rotation actuator across an opening formed at a center of the third table and which is moved by a straight moving actuator along the X direction such that the chip supply pallet is held from both sides in the X direction by the pallet fixing portion and the pallet holding portion, thereby fixing the chip supply pallet on the third table,
wherein the pallet holding portion is axially supported by the rotation actuator to be horizontally turnable by 180 degrees.

6. The chip supply apparatus according to claim 5, further comprising a restricting unit for restricting a relative rotational displacement of the first member and the second member.

7. The chip supply pallet according to claim 1, wherein the ring frame is pushed down along the inclined face without being secured to the inclined face.

* * * * *